(12) United States Patent
Hirose et al.

(10) Patent No.: US 11,835,388 B2
(45) Date of Patent: Dec. 5, 2023

(54) LIGHT DETECTION DEVICE

(71) Applicant: HAMAMATSU PHOTONICS K.K., Hamamatsu (JP)

(72) Inventors: Masaki Hirose, Hamamatsu (JP); Katsumi Shibayama, Hamamatsu (JP); Takashi Kasahara, Hamamatsu (JP); Toshimitsu Kawai, Hamamatsu (JP); Hiroki Oyama, Hamamatsu (JP); Yumi Teramachi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 400 days.

(21) Appl. No.: 16/843,244

(22) Filed: Apr. 8, 2020

(65) Prior Publication Data

US 2020/0232852 A1 Jul. 23, 2020

Related U.S. Application Data

(62) Division of application No. 15/764,943, filed as application No. PCT/JP2016/078476 on Sep. 27, 2016, now Pat. No. 10,656,020.

(30) Foreign Application Priority Data

Oct. 2, 2015 (JP) ................................. 2015-196516
May 31, 2016 (JP) ................................. 2016-109495

(51) Int. Cl.
*G01J 5/08* (2022.01)
*G01J 3/26* (2006.01)
(Continued)

(52) U.S. Cl.
CPC ............... *G01J 3/26* (2013.01); *G01J 3/0213* (2013.01); *G01J 3/0256* (2013.01);
(Continued)

(58) Field of Classification Search
CPC .......... G01J 3/26; G01J 3/0213; G01J 3/0256; G01J 3/0291; G01J 5/0802; G01J 5/20;
(Continued)

(56) References Cited

U.S. PATENT DOCUMENTS 6,747,742 B1 *  6/2004  Verma .................... G01J 3/02
                                                  356/454
2007/0153287 A1 *  7/2007  Lin ........................ G01J 3/027
                                                  356/519

(Continued)

FOREIGN PATENT DOCUMENTS

CN          101542251 A     9/2009
CN          102789993 A    11/2012
(Continued)

OTHER PUBLICATIONS

International Preliminary Report on Patentability dated Apr. 12, 2018 for PCT/JP2016/078476.

(Continued)

*Primary Examiner* — Marcus H Taningco
(74) *Attorney, Agent, or Firm* — Faegre Drinker Biddle & Reath LLP

(57) ABSTRACT

A light detection device includes: a Fabry-Perot interference filter provided with a light transmission region; a light detector configured to detect light transmitted through the light transmission region; a package having an opening and accommodating the Fabry-Perot interference filter and the light detector; and a light transmitting unit arranged on an inner surface of the package so as to close an opening, the light transmitting unit including a band pass filter configured to transmit light incident on the light transmission region. When viewed from a direction parallel to the line, an outer edge of the Fabry-Pert interference filter is positioned outside an outer edge of the opening, and an outer edge of the (Continued)

light transmitting unit is positioned outside the outer edge of the Fabry-Perot interference filter.

7 Claims, 17 Drawing Sheets

(51) Int. Cl.
    *G02B 26/00*     (2006.01)
    *G01J 3/02*     (2006.01)
    *G01J 5/0802*     (2022.01)
    *G01J 5/20*     (2006.01)
    *G02F 1/21*     (2006.01)
    *H01L 31/02*     (2006.01)
    *H01L 31/0203*     (2014.01)
    *H01L 31/0232*     (2014.01)
    *H01L 31/0304*     (2006.01)
    *G01J 5/04*     (2006.01)
    *H10N 15/10*     (2023.01)
(52) U.S. Cl.
    CPC ........... *G01J 3/0291* (2013.01); *G01J 5/0802* (2022.01); *G01J 5/20* (2013.01); *G02B 26/00* (2013.01); *G02F 1/21* (2013.01); *H01L 31/0203* (2013.01); *H01L 31/02005* (2013.01); *H01L 31/02327* (2013.01); *H01L 31/03046* (2013.01); *G01J 5/045* (2013.01); *G02F 1/213* (2021.01); *H10N 15/10* (2023.02)
(58) Field of Classification Search
    CPC ............ G01J 5/045; G02B 26/00; G02F 1/21; G02F 1/213; H01L 31/02005; H01L 31/0203; H01L 31/02327; H01L 31/03046; H01L 37/02
    See application file for complete search history.

(56) References Cited

U.S. PATENT DOCUMENTS

| | | | |
|---|---|---|---|
| 2008/0049228 A1* | 2/2008 | Chan | G01J 3/26 356/450 |
| 2011/0029041 A1* | 2/2011 | Wiskerke | A61N 1/36038 607/57 |
| 2011/0279824 A1* | 11/2011 | Blomberg | G02B 26/001 356/519 |
| 2016/0245697 A1 | 8/2016 | Shibayama et al. | |
| 2016/0282181 A1 | 9/2016 | Shibayama et al. | |
| 2017/0059392 A1* | 3/2017 | Lam | G01S 7/4802 |

FOREIGN PATENT DOCUMENTS

| | | |
|---|---|---|
| CN | 103245998 A | 8/2013 |
| CN | 104049293 A | 9/2014 |
| JP | S58-178647 | 11/1983 |
| JP | 2014-013339 A | 1/2014 |
| JP | 2015-49276 A | 3/2015 |
| JP | 2015-049276 A | 3/2015 |
| TW | I240794 B | 10/2005 |
| TW | I495855 B | 8/2015 |
| WO | WO-2015-064750 A1 | 5/2015 |
| WO | WO 2015/064758 A1 | 5/2015 |

OTHER PUBLICATIONS

Larkko Antila, "Miniaturized Spectrometer Technologies", 9th Euro-American Workshop on Information Optics (WIO), 2010, XP031760871.

* cited by examiner

LIGHT DETECTION DEVICE

TECHNICAL FIELD

The present disclosure relates to a light detection device including a Fabry-Perot interference filter having a first mirror and a second mirror, a distance therebetween is variable.

BACKGROUND ART

A light detection device including: a Fabry-Perot interference filter having a first mirror and a second mirror, a distance therebetween is variable; a light detector for detecting light transmitted through the Fabry-Perot interference filter; a package accommodating the Fabry-Perot interference filter and the light detector; and a light transmitting unit arranged on an inner surface of the package so as to close an opening of the package is known (see Patent Literature 1, for example).

CITATION LIST

Patent Literature

Patent Literature 1: WO 15/064758 A

SUMMARY OF INVENTION

Technical Problem

From the viewpoint of improving the S/N ratio and resolution, in light detection devices as described above, it is quite important to suppress stray light (light not passing through the light transmission region of the Fabry-Perot interference filter) from entering the light detector. Moreover, since it is necessary to control the distance between a first mirror and a second mirror with an extremely high accuracy in a Fabry-Perot interference filter, it is extremely important to uniformize the temperature in the package in order to suppress variations in the stress generated in the Fabry-Perot interference filter due to a change in the temperature in the use environment.

Therefore, one embodiment of the present disclosure aims at providing a light detection device having high light detecting characteristics.

Solution to Problem

A light detection device according to one embodiment of the present disclosure includes: a Fabry-Perot interference filter having a first mirror and a second mirror, a distance therebetween is variable, and provided with a light transmission region on a predetermined line, the light transmission region configured to transmit light corresponding to the distance between the first mirror and the second mirror, the light transmission region provided on a predetermined line; a light detector arranged on a first side of the Fabry-Perot interference filter on the line, the light detector configured to detect light transmitted through the light transmission region; a package having an opening positioned on a second side of the Fabry-Perot interference filter on the line, the package configured to accommodate the Fabry-Perot interference filter and the light detector; and a light transmitting unit arranged on an inner surface of the package so as to close the opening and including a band pass filter configured to transmit light incident on the light transmission region, in which, when viewed from a direction parallel to the line, an outer edge of the Fabry-Perot interference filter is positioned outside an outer edge of the opening and an outer edge of the light transmitting unit is positioned outside the outer edge of the Fabry-Perot interference filter.

In this light detection device, the outer edge of the Fabry-Perot interference filter is positioned outside the outer edge of the opening of the package, and the outer edge of the light transmitting unit including the band pass filter is positioned outside the outer edge of the Fabry-Perot interference filter. This can prevent light from entering the package via a side surface (a surface excluding a light incident surface and a light emitting surface facing each other in a direction parallel to the predetermined line in the light transmitting member) of the light transmitting unit due to an incident angle of light at the opening of the package, diffraction at the opening of the package, etc. and becoming stray light. Moreover, it is possible to prevent light, which has become stray light due to an incident angle of light at the opening of the package, diffraction at the opening of the package, etc., from entering the light detector. Furthermore, for example as compared to a case where the outer edge of the light transmitting unit is positioned inside the outer edge of the Fabry-Perot interference filter, the heat capacity of the light transmitting unit and a thermally connected area between the light transmitting unit and the package increases, and thus as a result the temperature in the package can be uniformized. As described above, the light detection device has high light detecting characteristics.

In the light detection device according to one embodiment of the present disclosure, the light transmitting unit may further include a light transmitting member provided with a band pass filter, and the outer edge of the light transmitting member may be positioned outside the outer edge of the Fabry-Perot interference filter when viewed from a direction parallel to the line. That is, the light detection device in this case (light detection device of the first aspect) includes: a Fabry-Perot interference filter having a first mirror and a second mirror, a distance therebetween is variable, and provided with a light transmission region on a predetermined line, the light transmission region configured to transmit light corresponding to the distance between the first mirror and the second mirror, the light transmission region provided on a predetermined line; a light detector arranged on one side (first side) of the Fabry-Perot interference filter on the line, the light detector configured to detect light transmitted through the light transmission region; a package having an opening positioned on the other side (second side) of the Fabry-Perot interference filter on the line, the package configured to accommodate the Fabry-Perot interference filter and the light detector; a light transmitting member arranged on an inner surface of the package so as to close the opening; and a band pass filter provided to the light transmitting member, in which, when viewed from a direction parallel to the line, an outer edge of the Fabry-Perot interference filter is positioned outside an outer edge of the opening, and an outer edge of the light transmitting member is positioned outside the outer edge of the Fabry-Perot interference filter.

In the light detection device of the first aspect, the outer edge of the Fabry-Perot interference filter is positioned outside the outer edge of the opening of the package, and the outer edge of the light transmitting member is positioned outside the outer edge of the Fabry-Perot interference filter. This can prevent light from entering the package via a side surface (a surface excluding a light incident surface and a light emitting surface facing each other in a direction parallel to the predetermined line in the light transmitting member) of the light transmitting member due to an incident angle of light at the opening of the package, diffraction at the opening of the package, etc. and becoming stray light. Moreover, it is possible to prevent light, which has become stray light due to an incident angle of light at the opening of the package, diffraction at the opening of the package, etc., from entering the light detector. Furthermore, for example as compared to a case where the outer edge of the light transmitting member is positioned inside the outer edge of the Fabry-Perot interference filter, the heat capacity of the light transmitting member and a thermally connected area between the light transmitting member and the package increases, and thus as a result the temperature in the package can be uniformized. As described above, in the light detection device of the first aspect, light detecting characteristics are enhanced.

In the light detection device of the first aspect, the outer edge of the band pass filter may be positioned outside the outer edge of the Fabry-Perot interference filter when viewed from a direction parallel to the line. This ensures that light incident on the light transmission region of the Fabry-Perot interference filter has passed through the band pass filter.

In the light detection device of the first aspect, the thickness of the light transmitting member may be a value larger than or equal to a value obtained by multiplying the distance between the Fabry-Perot interference filter and the light transmitting member by 0.5. As a result, since the heat capacity of the light transmitting member is increased while the volume of the space in the package is reduced, the temperature in the package can be further uniformized.

In the light detection device of the first aspect, the Fabry-Perot interference filter may have a silicon substrate supporting the first mirror and the second mirror, and the light detector may have an InGaAs substrate formed with a photoelectric conversion region. The light detector having the InGaAs substrate formed with the photoelectric conversion region has a high sensitivity to light having a wavelength within a range between 1200 nm and 2100 nm, for example, as compared to light having a wavelength shorter than 1200 nm and light having a wavelength longer than 2100 nm. However, the light detector has a high sensitivity to light having a wavelength shorter than 1200 nm as compared with light having a wavelength longer than 2100 nm. Meanwhile, the silicon substrate has a higher absorptivity to light having a wavelength shorter than 1200 nm as compared with light having a wavelength of 1200 nm or more (although this depends on a manufacturing method, the thickness, and an impurity concentration of the silicon substrate, a high absorptivity is exhibited especially for light having a wavelength shorter than 1100 nm). Therefore, with the above configuration, for example in a case where light having a wavelength within the range between 1200 nm and 2100 nm should be detected, the silicon substrate of the Fabry-Perot interference filter can be caused to function as a high-pass filter. As a result, it is possible to securely suppress detection of noise light (light having a wavelength shorter than 1200 nm (in particular, shorter than 1100 nm) and light having a wavelength longer than 2100 nm) by the light detector by the synergistic effect with the band pass filter.

In the light detection device of the first aspect, the band pass filter may be provided on the light emitting surface of the light transmitting member. As a result, it is possible to prevent occurrence of a damage such as a scratch in the band pass filter due to external physical interference.

The light detection device of the first aspect may further include a lead pin passing through the package and a wire electrically connecting the terminal of the Fabry-Perot interference filter and the lead pin. As described above, in this light detection device, the outer edge of the Fabry-Perot interference filter is positioned outside the outer edge of the opening of the package, and the outer edge of the light transmitting member is positioned outside the outer edge of the Fabry-Perot interference filter. Therefore, even if the wire bends, contact between the wire and the package can be prevented.

A light detection device according to one embodiment of the present disclosure may further include a bonding member, in which the band pass filter may have a polygonal plate shape, the package may have a first wall part formed with the opening, a second wall part facing the first wall part with the Fabry-Perot interference filter, the band pass filter, and the light detector interposed therebetween, and a cylindrical side wall part surrounding the Fabry-Perot interference filter, the band pass filter, and the light detector, the bonding member may fix the band pass filter to an inner surface of the first wall part, and an outer edge of the band pass filter may be positioned outside the outer edge of the Fabry-Perot interference filter when viewed from a direction parallel to the line. That is, the light detection device in this case (light detection device of the second aspect) includes: a Fabry-Perot interference filter having a first mirror and a second mirror, a distance therebetween is variable, and provided with a light transmission region on a predetermined line, the light transmission region configured to transmit light corresponding to the distance between the first mirror and the second mirror, the light transmission region provided on a predetermined line; a band pass filter arranged on one side (second side) of the Fabry-Perot interference filter on the line, the band pass filter of a polygonal plate shape configured to transmit light incident on the tight transmission region; an light detector arranged on the other side (first side) of the Fabry-Perot interference filter on the line, the light detector configured to detect light transmitted through the light transmission region; a package having a first wall part formed with an opening (light incident opening) at a position on one side of the band pass filter on the line, a second wall part facing the first wall part with the Fabry-Perot interference filter, the band pass filter, and the light detector interposed therebetween, and a cylindrical side wall part surrounding the Fabry-Perot interference filter, the band pass filter, and the light detector, and a bonding member configured to fix the band pass filter on an inner surface of the first wall part, in which, when viewed from a direction parallel to the line, an outer edge of the Fabry-Perot interference filter is positioned outside an outer edge of the opening, and an outer edge of the band pass filter is positioned outside the outer edge of the Fabry-Perot interference filter.

In light detection devices described as those of the background art, for example in order to obtain an optical spectrum for light in a predetermined wavelength range, it is necessary that a band pass filter transmits only light in the wavelength range. That is, in order to improve light detecting characteristics of the light detection device, it is important that the band pass filter functions properly. In this respect, in the light detection device of the second aspect, the side wall part of the package has a cylindrical shape while the band pass filter has a polygonal plate shape. As a result, as compared to the distance between each side surface (each surface excluding a light incident surface and a light emitting surface facing each other in a direction parallel to the predetermined line in the light transmitting member) of the band pass filter and an inner surface of the side wall part, the distance between each corner part (corner part formed by adjacent side surfaces) and the inner surface of the side wall part is smaller. Therefore, the band pass filter fixed to the inner surface of the first wall part of the package is positioned with a high accuracy by the respective corner parts. Here, for example in a case where a band pass filter has a circular plate shape, if the diameter of the band pass filter is increased such that the distance between a side surface of the band pass filter and an inner surface of a side wall part becomes smaller in order to implement high-precision positioning of the band pass filter, the following problem occurs. That is, since an area of a light incident surface of the band pass filter thermally connected to an inner surface of a first wall part of the package is increased, the band pass filter is easily affected by heat (deformation or other disadvantages due to heat) from the package. On the other hand, if a band pass filter has a polygonal plate shape, an area of a light incident surface of the band pass filter thermally connected to an inner surface of a first wall part of the package becomes smaller, for example as compared to the case where the band pass filter has a circular plate shape, and thus the band pass filter is less likely to be affected by heat from the package. Furthermore, since the outer edge of the Fabry-Perot interference filter is positioned outside the outer edge of the opening and the outer edge of the band pass filter is positioned outside the outer edge of the Fabry-Perot interference filter, it is ensured that light incident on the light transmission region of the Fabry-Perot interference filter has been transmitted through the band pass filter. As described above, according to the light detection device of the second aspect, the band pass filter can appropriately function.

The light detection device of the second aspect may further include a light transmitting member arranged on the inner surface of the first wall part so as to close the opening, in which the band pass filter may be fixed to an inner surface of the light transmitting member by the bonding member, and the bonding member may be arranged over the entire region of a light incident surface of the band pass filter facing the inner surface of the light transmitting member. According to this configuration, since the bonding member is arranged over the entire region of the light incident surface of the band pass filter, the band pass filter is securely fixed to the inner surface of the first wall part. Furthermore, even if air bubbles are generated in the bonding member at the time of manufacturing, the air bubbles easily escape from between the side surfaces of the band pass filter and the inner surface of the side wall part, scattering, diffraction, and the like at the bonding member are suppressed. Moreover, according to this configuration, since the light transmitting member is provided, airtightness of the package is improved. Furthermore, since the band pass filter is fixed to the inner surface of the light transmitting member, thermal influence from the package is unlikely to be received.

The light detection device of the second aspect may further include a light transmitting member arranged on the inner surface of the first wall part so as to close the opening, in which the band pass filter may be fixed to an inner surface of the light transmitting member by the bonding member, and the bonding member may not be arranged at a region excluding a corner region in a light incident surface of the band pass filter facing the inner surface of the light transmitting member but be arranged at the corner regions. According to this configuration, since the bonding member is not arranged at a region excluding a corner region in the light incident surface of the band pass filter, scattering and diffraction of light and the like at the bonding member are more securely suppressed. Moreover, according to this configuration, since the light transmitting member is provided, airtightness of the package is improved. Furthermore, since the band pass filter is fixed to the inner surface of the light transmitting member and the bonding member is not arranged at the region excluding a corner region in the light incident surface of the band pass filter, a thermal influence from the package is further unlikely to be received.

In the light detection device of the second aspect, the band pass filter may be fixed to the inner surface of the first wall part by the bonding member, and the bonding member may be arranged at a region excluding an opposed region facing the opening in a light incident surface of the band pass filter facing the inner surface of the first wall part. According to this configuration, since the bonding member is arranged at the region excluding an opposed region facing the opening in the light incident surface of the band pass filter, the band pass filter is securely fixed on the inner surface of the first wall part. Furthermore, even if air bubbles are generated in the bonding member at the time of manufacturing, the air bubbles easily escape not only from between the side surfaces of the band pass filter and the inner surface of the side wall part but also from the opening, scattering, diffraction, and the like at the bonding member are suppressed.

In the light detection device of the second aspect, the band pass filter may be fixed to the inner surface of the first wall part by the bonding member, and the bonding member may not be arranged at a region excluding a corner region in a light incident surface of the band pass filter facing the inner surface of the first wall part but be arranged in the corner region. According to this configuration, since the bonding member is not arranged at a region excluding a corner region in the light incident surface of the band pass filter, scattering and diffraction of light and the like at the bonding member are more securely suppressed.

In the light detection device of the second aspect, the bonding member may protrude outward from the outer edge of the band pass filter when viewed from a direction parallel to the line, and a part of the bonding member protruding outward from the outer edge of the band pass filter may be in contact with a side surface of the band pass filter. According to this configuration, the band pass filter is more securely fixed.

In the light detection device of the second aspect, the opening may have a circular shape when viewed from a direction parallel to the line. According to this configuration, the intensity profile of light incident on the package is uniformized.

In the light detection device of the second aspect, the band pass filter may have a rectangular plate shape. According to this configuration, it is possible to effectively suppress the thermal influence given to the band pass filter from the package while the stability in fixing of the band pass filter on the inner surface of the first wall part of the package is ensured.

In the light detection device of the second aspect, the package may be made of a metal material. According to this configuration, airtightness of the package is improved, and electrical shielding is facilitated. Note that in the case where the package is formed of a metal material, the thermal conductivity of the package is increased. However as described above, since the side wall part of the package has a cylindrical shape while the band pass filter has a polygonal plate shape, the band pass filter is unlikely to be affected by heat from the package.

Advantageous Effects of Invention

According to one embodiment of the present disclosure, a light detection device having high light detecting characteristics can be provided.

DESCRIPTION OF EMBODIMENTS

Hereinafter, embodiments of the present disclosure will be described in detail with reference to the drawings. Note that the same or corresponding parts in the respective drawings are denoted with the same symbol, and overlapping descriptions are omitted.

First Embodiment

[Configuration of Light Detection Device]

Figure 1:
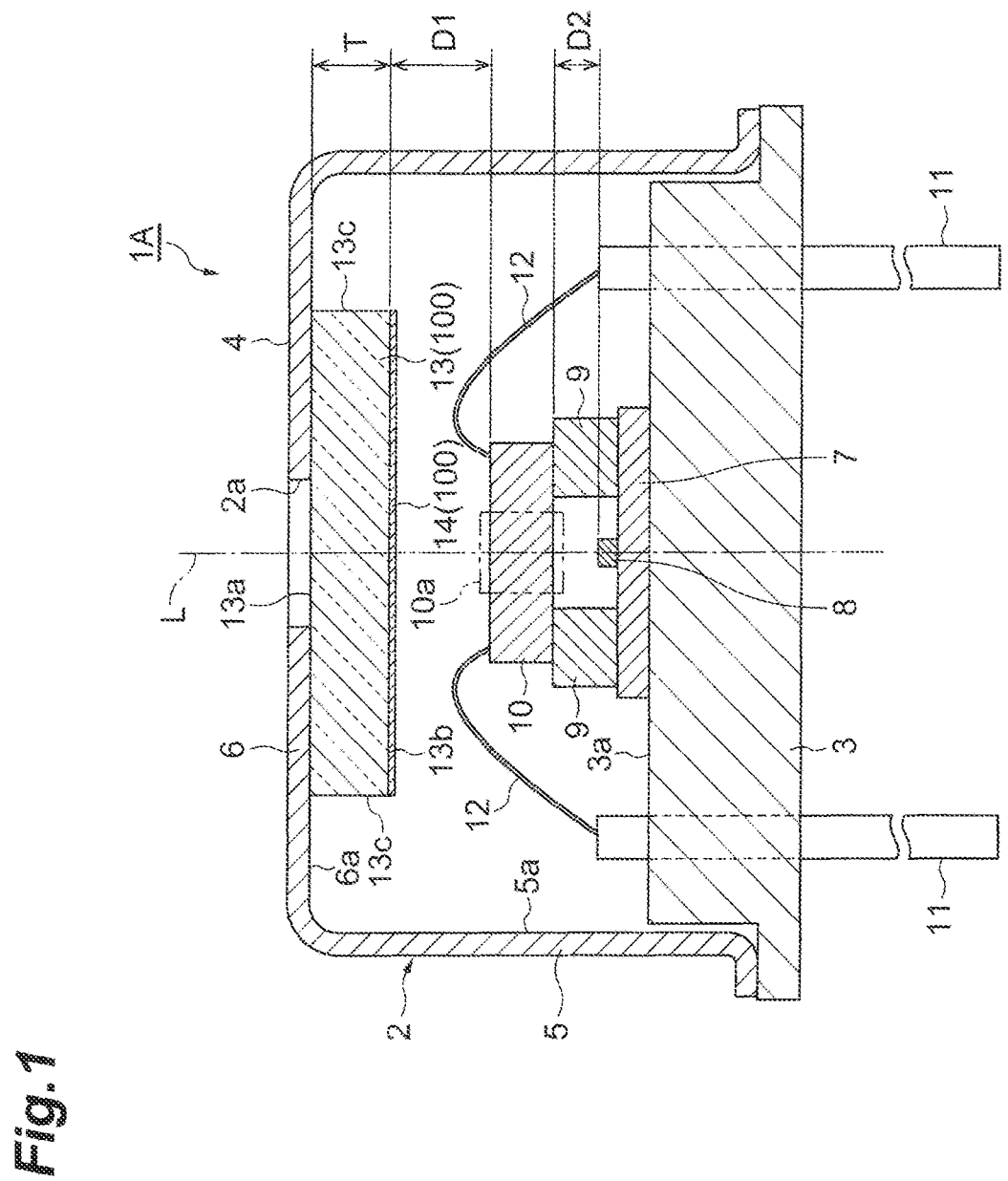
FIG. 1 is a cross-sectional view of a light detection device of a first embodiment.

As illustrated in FIG. 1, a light detection device 1A includes a package 2. The package 2 is a CAN package having a stem 3 and a cap 4. The cap 4 is integrally formed by a side wall 5 and a top wall 6. The top wall 6 faces the stem 3 in a direction parallel to a predetermined line L. The stem 3 and the cap 4 are made of metal, for example, and are airtightly joined to each other.

On an inner surface 3a of the stem 3, a wiring substrate 7 is fixed. As a material of the wiring substrate 7, for example, silicon, ceramic, quartz, glass, plastic, or other materials can be used. On the wiring substrate 7, a temperature compensating element (not illustrated) such as a light detector 8 and a thermistor is mounted. The light detector 8 is arranged on the line L. More specifically, the light detector 8 is arranged such that the center line of a light receiving unit thereof coincides with the line L. The light detector 8 is an infrared detector such as a quantum type sensor using InGaAs or other compounds or a thermal type sensor using a thermopile or a bolometer or other instruments. In a case where light of different wavelength regions of ultraviolet, visible, and near infrared regions, for example a silicon photodiode or other components can be used as the light detector 8. Note that the light detector 8 may include one light receiving unit or may include a plurality of light receiving units in an arrayed shape. Furthermore, a plurality of light detectors 8 may be mounted on the wiring substrate 7.

On the wiring substrate 7, a plurality of spacers 9 are fixed. As a material of the spacers 9, for example, silicon, ceramic, quartz, glass, plastic, or other materials can be used. On the plurality of spacers 9, a Fabry-Perot interference filter 10 is fixed by, for example, an adhesive agent. The Fabry-Perot interference filter 10 is arranged on the line L. More specifically, the Fabry-Perot interference filter 10 is arranged such that the center line of a light transmission region 1.a coincides with the line L. Note that the spacers 9 may be integrally formed with the wiring substrate 7. The Fabry-Perot interference filter 10 may be supported not by the plurality of spacers 9 but by one spacer 9.

A plurality of lead pins 11 are fixed to the stem 3. More specifically, each of the lead pins 11 penetrates through the stem 3 in a state where electrical insulation and airtightness with the stem 3 is maintained. Electrode pads provided on the wiring substrate 7, terminals of the light detector 8, terminals of the temperature compensating element, and terminals of the Fabry-Perot interference filter 10 are electrically connected to the respective lead pins 11 by wires 12. This enables input and output of electric signals to and from each of the light detector 8, the temperature compensating element, and the Fabry-Perot interference filter 10.

The package 2 includes an opening 2a. More specifically, the opening 2a is included in the top wall 6 of the cap 4 such that the center line thereof coincides with the line L. On an inner surface 6a of the top wall 6, a light transmitting member 13 is arranged so as to close the opening 2a. The light transmitting member 13 is airtightly joined to the inner surface 6a of the top wall 6. The light transmitting member 13 transmits light at least in a range of measurement wavelengths of the light detection device 1A. The light transmitting member 13 is a plate-like member including a light incident surface 13a and a light emitting surface 13b that face each other in a direction parallel to the line L and side surfaces 13c. The light transmitting member 13 is made of, for example, glass, quartz, silicon, germanium, plastic, or other materials.

A band pass filter 14 is provided on the light emitting surface 13b of the light transmitting member 13. The band pass filter 14 is arranged on the light emitting surface 13b of the light transmitting member 13 by, for example, vapor deposition, pasting, or other means. The band pass filter 14 selectively transmits light in a range of measurement wavelengths of the light detection device 1A. The band pass filter 14 is a dielectric multilayer film formed by a combination of a high refractive material such as $TiO_2$ and $Ta_2O_5$ and a low refractive material such as $SiO_2$ and $MgF_2$.

In the light detection device 1A, the light transmitting member 13 and the band pass filter 14 form the light transmitting unit 100. That is, the light transmitting unit 100 includes the band pass filter 14 that transmits light incident on the light transmission region 10a of the Fabry-Perot interference filter 10.

In the light detection device 1A, the package 2 accommodates the wiring substrate 7, the light detector 8, the temperature compensating element (not illustrated), the plurality of spacers 9, and the Fabry-Perot interference filter 10. In the package 2, the light detector 8 is positioned on one side (first side) of the Fabry-Perot interference filter 10 on the line L, and the opening 2a and the light transmitting member 13 are positioned on the other side (second side) of the Fabry-Perot interference filter 10 on the line L.

A thickness T of the light transmitting member 13 (thickness in a direction parallel to the line L, which is a distance between the light incident surface 13a and the light emitting surface 13b) is greater than or equal to a value obtained by multiplying a distance D1 between the Fabry-Perot interference filter 10 and the light transmitting member 13 (distance between a surface of the Fabry-Perot interference filter 10 on the light transmitting member 13 side and the light emitting surface 13b of the light transmitting member 13) by 0.5. Moreover, the thickness T of the light transmitting member 13 is greater than or equal to a distance D2 between the Fabry-Perot interference filter 10 and the light detector 8 (distance between a surface of the Fabry-Perot interference filter 10 on the light detector 8 side and a surface of the light detector 8 on the Fabry-Perot interference filter 10 side).

Figure 2:
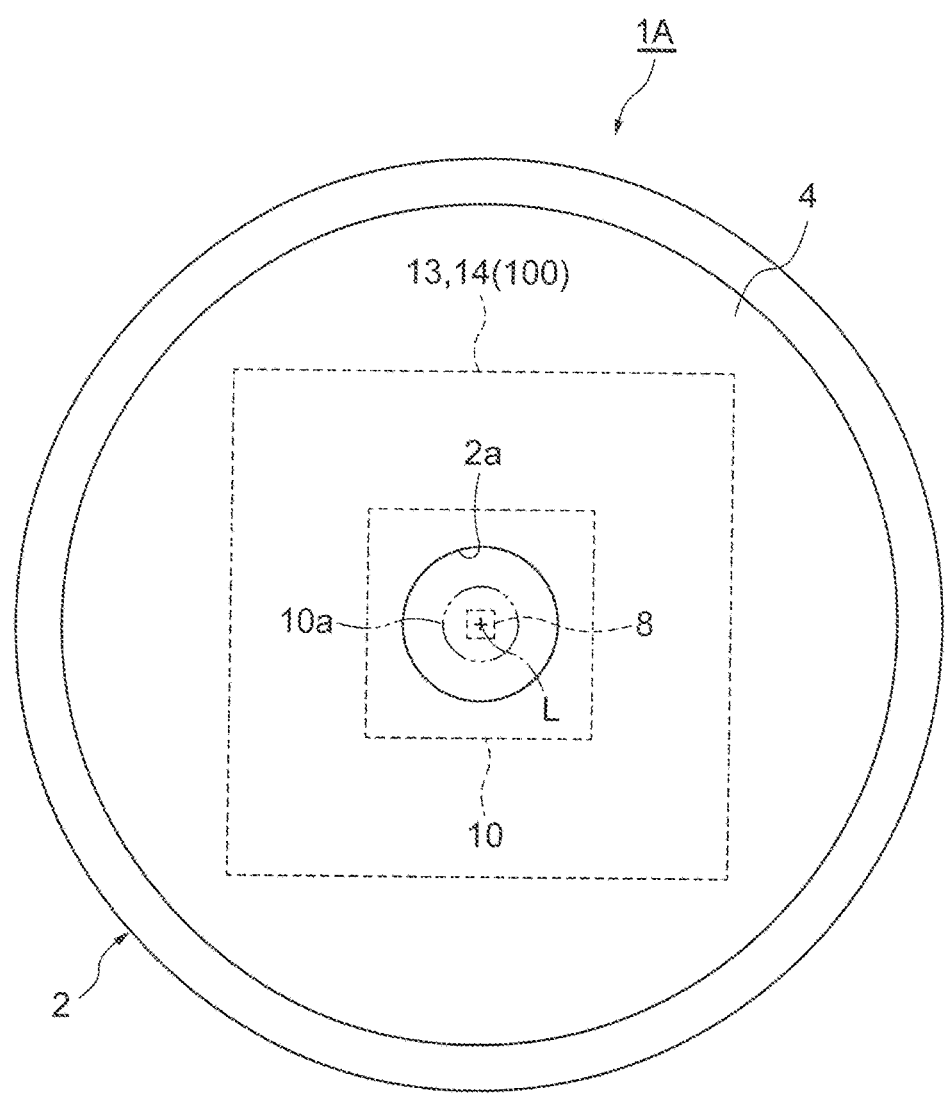
FIG. 2 is a plan view of the light detection device of FIG. 1.

The positional relationship and sizes of the respective components when viewed from a direction parallel to the line L are as follows. As illustrated in FIG. 2, the center line of the opening 2a, the center line of the light transmitting member 13, the center line of the band pass filter 14, the center line of the light transmission region 10a of the Fabry-Perot interference filter 10, and the center line of the light receiving unit of the light detector 8 coincides with the line L. The opening 2a and an outer edge of the light transmission region 10a of the Fabry-Perot interference filter 10 are, for example, circular. The outer edges of the light transmitting member 13, the band pass filter 14, the Fabry-Perot interference filter 10, and the light detector 8 are, for example, rectangular.

The outer edge of the light transmission region 10a of the Fabry-Perot interference filter 10 is positioned outside the outer edge of the light detector 8. The outer edge of the opening 2a is positioned outside the outer edge of the light transmission region 10a of the Fabry-Perot interference filter 10. The outer edge of the band pass filter 14 is positioned outside the outer edge of the opening 2a. The outer edge of the Fabry-Perot interference filter 10 is positioned outside the outer edge of the opening 2a. The outer edge of the Fabry-Perot interference filter 10 is positioned outside the outer edge of the light detector 8. The outer edge of the band pass filter 14 is positioned outside the outer edge of the Fabry-Perot interference filter 10. The outer edge of the light transmitting member 13 is positioned outside the outer edge of the Fabry-Perot interference filter 10. In the light detection device 1A, the outer edge of the light transmitting member 13 and the outer edge of the band pass filter 14 coincide with each other. Note that "one outer edge is positioned outside another outer edge when viewed from a predetermined direction" means that "the outer edge surrounds the other outer edge when viewed from the predetermined direction" or that "the outer edge includes the other outer edge when viewed from the predetermined direction".

In the light detection device 1A configured as described above, when light enters the light transmission region 10a of the Fabry-Perot interference filter 10 from the outside via the opening 2a, the light transmitting member 13, and the band pass filter 14, light having a predetermined wavelength is selectively transmitted (details will be described later). The light transmitted through the light transmission region 10a of the Fabry-Perot interference filter 10 enters the light receiving unit of the light detector 8 and is detected by the light detector 8.

[Configuration of Fabry-Perot Interference Filter]

Figure 3:
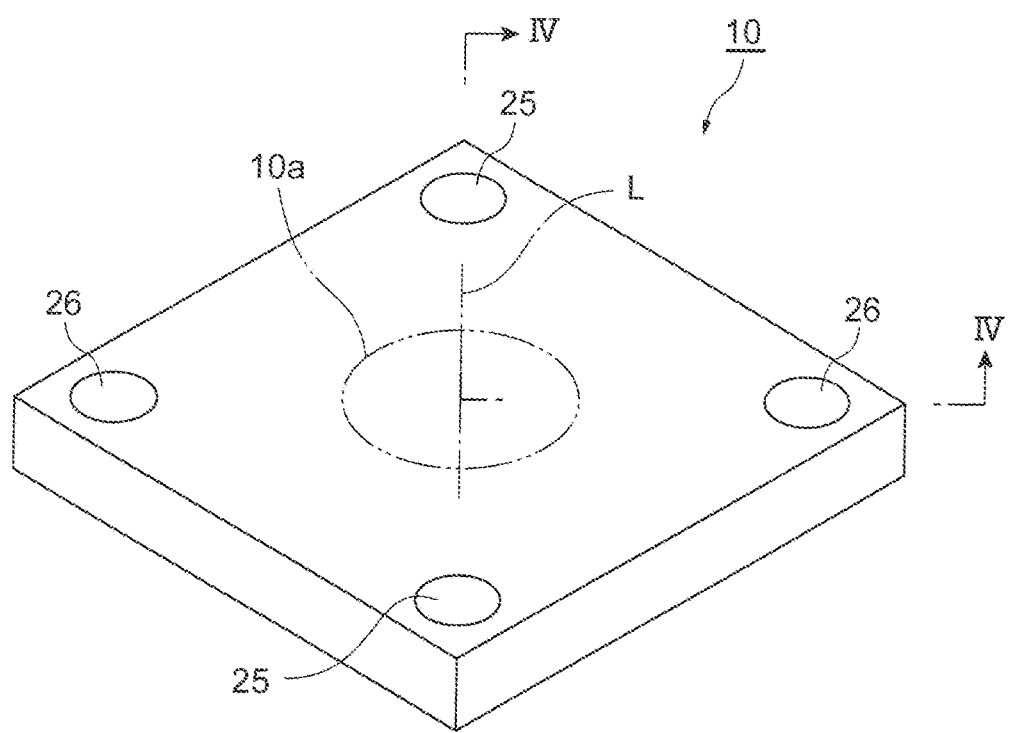
FIG. 3 is a perspective view of a Fabry-Perot interference filter of the light detection device of FIG. 1.

As illustrated in FIG. 3, in the Fabry-Perot interference filter 10, a light transmission region 10a that transmits light corresponding to the distance between a first mirror and a second mirror is included on the line L. In the light transmission region 10a, the distance between the first mirror and the second mirror is controlled with an extremely high accuracy. That is, in the Fabry-Perot interference filter 10, the light transmission region 10a is a region in which the distance between the first mirror and the second mirror can be controlled to a predetermined distance in order to selectively transmit light having a predetermined wavelength and is a region through which light having a predetermined wavelength corresponding to the distance between the first mirror and the second mirror can be transmitted.

Figure 4:
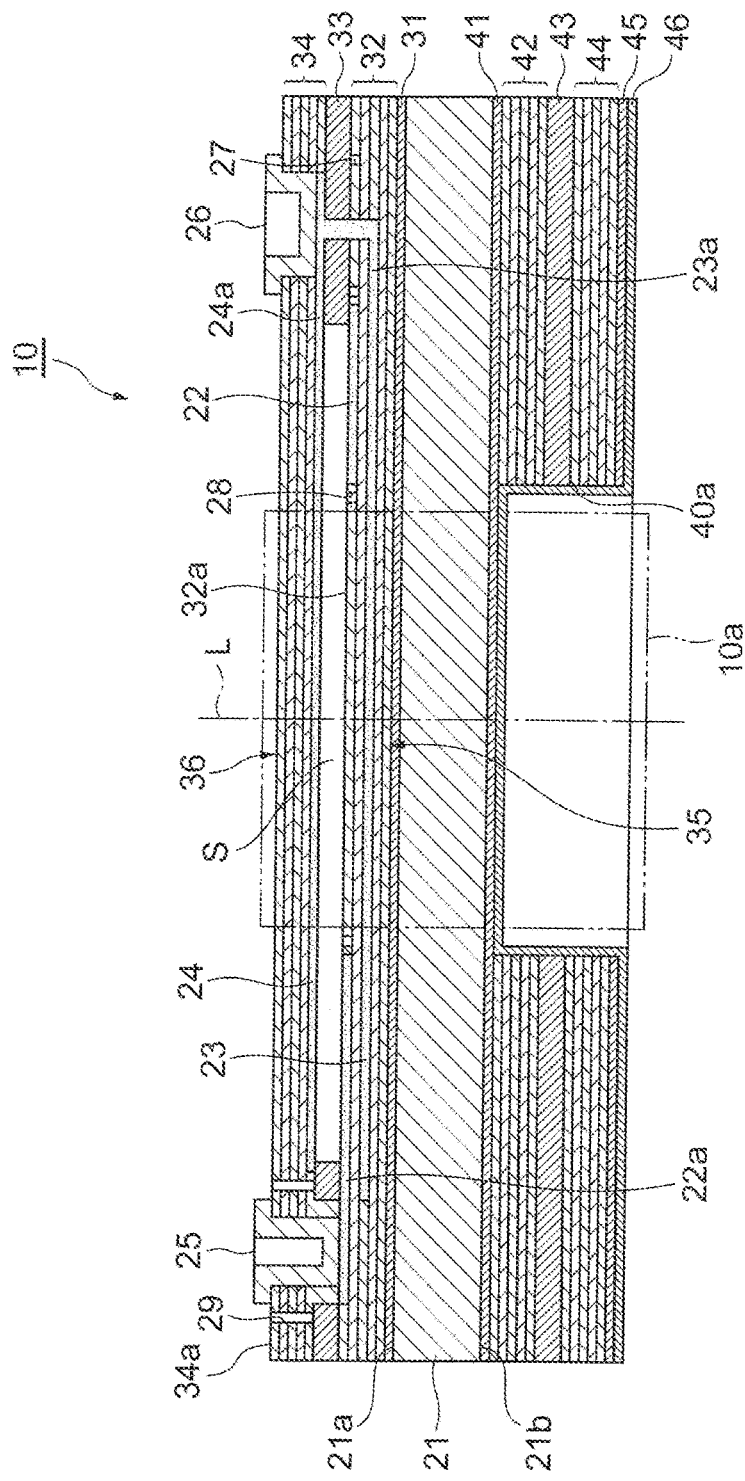
FIG. 4 is a cross-sectional view of the Fabry-Perot interference filter taken along line IV-IV in FIG. 3.

As illustrated in FIG. 4, the Fabry-Perot interference filter 10 includes a substrate 21. On a surface 21a of the substrate 21 on a light incident side, an antireflection layer 31, a first laminated body 32, an intermediate layer 33, and a second laminated body 34 are laminated in the order mentioned. A gap (air gap) S is formed between the first laminated body 32 and the second laminated body 34 by the intermediate layer 33 of a frame shape. The substrate 21 is made of, for example, silicon, quartz, glass, or other materials. In a case where the substrate 21 is made of silicon, the antireflection layer 31 and the intermediate layer 33 are made of, for example, silicon oxide. The thickness of the intermediate layer 33 may be an integral multiple obtained by multiplying the central transmission wavelength (that is, the central wavelength of a wavelength range that the Fabry-Perot interference filter 10 can transmit) by ½.

A part of the first laminated body 32 corresponding to the light transmission region 10a functions as a first mirror 35. The first mirror 35 is supported on the substrate 21 via the antireflection layer 31. The first laminated body 32 includes a plurality of polysilicon layers and a plurality of silicon nitride layers with each of the plurality of layers laminated alternately. The optical thickness of each of the polysilicon layers and the silicon nitride layers forming the first mirror 35 may be an integral multiple obtained by multiplying the central transmission wavelength by ¼. Note that a silicon oxide layer may be used instead of the silicon nitride layer.

A part of the second laminated body 34 corresponding to the light transmission region 10a functions as a second mirror 36 facing the first mirror 35 via the gap S. The second mirror 36 is supported on the substrate 21 via the antireflection layer 31, the first laminated body 32, and the intermediate layer 33. The second laminated body 34 includes a plurality of polysilicon layers and a plurality of silicon nitride layers with each of the plurality of layers laminated alternately. The optical thickness of each of the polysilicon layers and the silicon nitride layers forming the second mirror 36 may be an integral multiple obtained by multiplying the central transmission wavelength by ¼. Note that a silicon oxide layer may be used instead of the silicon nitride layer.

In a part of the second laminated body 34 corresponding to the gap S, a plurality of through holes (not illustrated) extending from a surface 34a of the second laminated body 34 to the gap S is included. The plurality of through holes is formed to an extent that the holes do not substantially affect the function of the second mirror 36. The plurality of through holes have been used to form the gap S by removing apart of the intermediate layer 33 by etching.

In the first mirror 35, a first electrode 22 is formed so as to surround the light transmission region 10a. In the first mirror 35, a second electrode 23 is formed so as to include the light transmission region 10a. The first electrode 22 and the second electrode 23 are formed by doping the polysilicon layer with an impurity to reduce the resistance. The size of the second electrode 23 may be a size including the entire light transmission region 10a or may be substantially the same size as that of the light transmission region 10a.

On the second mirror 36, a third electrode 24 is formed. The third electrode 24 faces the first electrode 22 and the second electrode 23 via the gap S in a direction parallel to the line L. The third electrode 24 is formed by doping the polysilicon layer with an impurity to reduce the resistance.

In the Fabry-Perot interference filter 10, the second electrode 23 is positioned on the side opposite to the third electrode 24 with respect to the first electrode 22 in a direction parallel to the line L. That is, the first electrode 22 and the second electrode 23 are not positioned on the same plane in the first mirror 35. The second electrode 23 is farther from the third electrode 24 than the first electrode 22 is.

A pair of terminals 25 are provided so as to face each other while interposing the light transmission region 10a. Each of the terminals 25 is arranged in a through hole extending from a surface 34a of the second laminated body 34 to the first laminated body 32. Each of the terminals 25 is electrically connected to the first electrode 22 via wiring 22a.

A pair of terminals 26 are provided so as to face each other while interposing the light transmission region 10a. Each of the terminals 26 is arranged in a through hole extending from the surface 34a of the second laminated body 34 to a layer before the intermediate layer 33. Each of the terminals 26 is electrically connected to the second electrode 23 via wiring 23a and is also electrically connected to the third electrode 24 via wiring 24a. Note that, a direction in which the pair of terminals 25 face each other and a direction in which the pair of terminals 26 face each other are perpendicular to each other (see FIG. 3).

Trenches 27 and 28 are included on the surface 32a of the first laminated body 32. A trench 27 annularly extends so as to surround the wiring 23a extending from a terminal 26 along a direction parallel to the line L. The trench 27 electrically insulates the first electrode 22 from the wiring 23a. A trench 28 annularly extends along the inner edge of the first electrode 22. The trench 28 electrically insulates the first electrode 22 from a region inside the first electrode 22. Regions inside the trenches 27 and 28 may be made of an insulating material or void.

Trenches 29 are included on the surface 34a of the second laminated body 34. A trench 29 annularly extends so as to surround a terminal 25. The trench 29 electrically insulates the terminal 25 from the third electrode 24. A region inside the trench 28 may be made of an insulating material or void.

On a surface 21b of the substrate 21 on a light emitting side, an antireflection layer 41, a third laminated body 42, an intermediate layer 43, and a fourth laminated body 44 are laminated in the order mentioned. The antireflection layer 41 and the intermediate layer 43 have a similar configuration to those of the antireflection layer 31 and the intermediate layer 33, respectively. The third laminated body 42 and the fourth laminated body 44 have lamination configurations symmetrical to those of the first laminated body 32 and the second laminated body 34, respectively, with respect to the substrate 21. The antireflection layer 41, the third laminated body 42, the intermediate layer 43, and the fourth laminated body 44 have a function of suppressing warping of the substrate 21.

The antireflection layer 41, the third laminated body 42, the intermediate layer 43, and the fourth laminated body 44 include an opening 40a so as to include the light transmission region 10a. The opening 40a has substantially the same diameter as the size of the light transmission region 10a. The opening 40a is open on the light emitting side while a bottom surface of the opening 40a reaches the antireflection layer 41. A light shielding layer 45 is formed on a surface of the fourth laminated body 44 on the light emitting side. The light shielding layer 45 is made of, for example, aluminum. A protective layer 46 is formed on a surface of the light shielding layer 45 and an inner surface of the opening 40a. The protective layer 46 is made of, for example, aluminum oxide. Note that, by setting the thickness of the protective layer 46 at 1 to 100 nm (preferably, about 30 nm), optical influence by the protective layer 46 can be negligible.

In the Fabry-Perot interference filter 10 configured in the above manner, when a voltage is applied between the first electrode 22 and the third electrode 24 via the respective terminals 25 and 26, electrostatic force corresponding to the voltage is generated between the first electrode 22 and the third electrode 24. Due to the electrostatic force, the second mirror 36 is attracted to the side of the first mirror 35 fixed to the substrate 21, and the distance between the first mirror 35 and the second mirror 36 is adjusted. As described above, in the Fabry-Perot interference filter 10, the distance between the first mirror 35 and the second mirror 36 is allowed to be variable.

The wavelength of light transmitted through the Fabry-Perot interference filter 10 depends on the distance between the first mirror 35 and the second mirror 36 in the light transmission region 10a. Therefore, by adjusting the voltage applied between the first electrode 22 and the third electrode 24, a wavelength of transmitted light can be selected as appropriate. At this time, the second electrode 23 has the same potential as that of the third electrode 24. Therefore, the second electrode 23 functions as a compensation electrode for keeping the first mirror 35 and the second mirror 36 flat in the light transmission region 10a.

The light detection device 1A can obtain an optical spectrum by detecting light transmitted through the light transmission region 10a of the Fabry-Perot interference filter 10 by the light detector 8 while changing the voltage applied to the Fabry-Perot interference filter 10 (that is, changing the distance between the first mirror 35 and the second mirror 36 in the Fabry-Perot interference filter 10).

[Actions and Effects]

In the light detection device 1A, the outer edge of the Fabry-Perot interference filter 10 of a chip shape is positioned outside the outer edge of the opening 2a of the package 2, and the outer edge (outer edge of the light transmitting unit 100) of the light transmitting member 13 is positioned outside the outer edge of the Fabry-Perot interference filter 10. This can prevent light from entering the package 2 via the side surfaces 13c of the light transmitting member 13 due to an incident angle of light at the opening 2a, diffraction at the opening 2a, etc. and becoming stray light. This can further prevent light, which has become stray light due to an incident angle of light at the opening 2a, diffraction at the opening 2a, etc., from entering the light detector 8. Furthermore, for example as compared to a case where the outer edge of the light transmitting member 13 is positioned inside the outer edge of the Fabry-Perot interference filter 10, the heat capacity of the light transmitting member 13 and a thermally connected area between the light transmitting member 13 and the package 2 increases, and thus as a result the temperature in the package 2 can be uniformized. As described above, light detecting characteristics are improved in the light detection device 1A.

The prevention of stray light from entering the light detector 8 will be described in more detail. A part of light entering the opening 2a of the package 2 may be emitted from the side surfaces 13c of the light transmitting member 13 into the package 2 due to an incident angle of light at the opening 2a, diffraction at the side surface of the opening 2a and at an emitting side corner (corer where the side surface of the opening 2a meets the inner surface 6a of the top wall 6), etc. When such light is multiple-reflected within the package 2 and enters the light detector 8, this appears as noise due to stray light in an output signal, which leads to degradation of light detecting characteristics. In particular, since the side surfaces 13c of the light transmitting member 13 are often rougher than the light incident surface 13a and the light emitting surface 13b in many cases, light emitted from the side surfaces 13c of the light transmitting member 13 into the package 2 is likely to be scattered and to enter the light detector 8. In contrast, in the light detection device 1A, the outer edge of the Fabry-Perot interference filter 10 is positioned outside the outer edge of the opening 2a of the package 2, and the outer edge of the light transmitting member 13 is positioned outside the outer edge of the Fabry-Perot interference filter 10. As a result, for example as compared with the case where the outer edge of the light transmitting member 13 is positioned inside the outer edge of the Fabry-Perot interference filter 10, the side surfaces 13c of the light transmitting member 13 are positioned apart from the light transmission region 10a of the Fabry-Perot interference filter 10 and the light detector 8. Therefore, the incidence of stray light on the light detector 8 is suppressed, and the S/N ratio and the resolution are improved.

The uniformizing of the temperature in the package 2 will be described more specifically. When the opening 2a of the package 2 becomes smaller, the volume of the package 2 itself becomes larger. Meanwhile, when the light transmitting member 13 is increased in size, the heat capacity of the light transmitting member 13 and a thermally connected area between the light transmitting member 13 and the package 2 are increased while the volume of the space in the package 2 is reduced. As a result, the following actions are obtained. First, the volume of the package 2 itself, which is made of metal, has a high thermal conductivity, and is easily maintained at a uniform temperature as a whole (heat easily spreads to the whole), is increased. Furthermore, since the thermally connected area between the light transmitting member 13 and the package 2 is large, heat is easily conducted from the package 2 to the light transmitting member 13, and the light transmitting member 13 is maintained at a uniform temperature with the package 2. Furthermore, since the volume of the space in the package 2 is small, the temperature of the space in the package 2 (and the constituent elements of the Fabry-Perot interference filter 10 and the like arranged therein) is also maintained at a uniform temperature by the influence of the package 2 and the light transmitting member 13 the temperature of which is maintained at a uniform temperature. Furthermore, temporal change in the temperature is suppressed by the light transmitting member 13 and the package 2 having a large heat capacity. By these actions, the temperature in the package 2 becomes thermally uniform, and the thermal characteristic of the light detection device 1A is stabilized.

Moreover, in the light detection device 1A, the outer edge of the band pass filter 14 is positioned outside the outer edge of the Fabry-Perot interference filter 10 when viewed from a direction parallel to the line L. As a result, it is ensured that light incident on the light transmission region 10a of the Fabry-Perot interference filter 10 has been transmitted by the band pass filter 14.

The outer edge of the light transmission region 10a of the Fabry-Perot interference filter 10 is positioned outside the outer edge of the light detector 8. The outer edge of the opening 2a is positioned outside the outer edge of the light transmission region 10a of the Fabry-Perot interference filter 10. The outer edge of the band pass filter 14 is positioned outside the outer edge of the opening 2a. As a result, it is ensured that light incident on the light detector 8 via the opening 2a and the light transmission region 10a of the Fabry-Perot interference filter 10 has been transmitted by the band pass filter 14.

The outer edge of the Fabry-Perot interference filter 10 is positioned outside the outer edge of the light detector 8. This can prevent light not transmitted by the light transmission region 10a of the Fabry-Perot interference filter 10 from entering the light detector 8 as stray light.

Moreover, in the light detection device 1A, the thickness T of the light transmitting member 13 is a value larger than or equal to a value obtained by multiplying the distance D1 between the Fabry-Perot interference filter 10 and the light transmitting member 13 by 0.5. As a result, since the heat capacity of the light transmitting member 13 is increased while the volume of the space in the package 2 is reduced, the temperature in the package 2 can be further uniformized. Furthermore, since the light transmitting member 13 moves relatively closer to the Fabry-Perot interference filter 10, this can prevent light not transmitted by the light transmission region 10a of the Fabry-Perot interference filter 10 from entering the light detector 8 as stray light. Note that, in order to further uniformize the temperature in the package 2 and to further suppress incidence of stray light on the light detector 8, it is preferable that the thickness T is a value larger than or equal to a value obtained by multiplying the distance D1 by 0.7, more preferably, a value greater than or equal to the distance D1.

Moreover, in the light detection device 1A, the thickness T of the light transmitting member 13 is a value larger than or equal to the distance D2 between the Fabry-Perot interference filter 10 and the light detector 8. As a result, since the heat capacity of the light transmitting member 13 is increased while the volume of the space in the package 2 is reduced, the temperature in the package 2 can be further uniformized.

In the light detection device 1A, the band pass filter 14 is provided on the light emitting surface 13b of the light transmitting member 13. As a result, it is possible to prevent occurrence of a damage such as a scratch in the band pass filter 14 due to external physical interference.

In the light detection device 1A, the terminals 25 and 26 of the Fabry-Perot interference filter 10 and the lead pins 11 are electrically connected by wires 12. As described above, in the light detection device 1A, the outer edge of the Fabry-Perot interference filter 10 is positioned outside the outer edge of the opening 2a of the package 2, and the outer edge of the light transmitting member 13 is positioned outside the outer edge of the Fabry-Perot interference filter 10. Therefore, even if the wires 12 bend, contact between the wires 12 and the package 2 can be prevented.

Prevention of contact between the wires 12 and the package 2 will be described more specifically. When a wire 12 is brought into contact with the package 2 made of metal, an electric signal for controlling the Fabry-Perot interference filter 10 also flows in the package 2, which makes it difficult to control the Fabry-Perot interference filter 10. Contrary to this, even when a wire 12 is brought into contact with the light transmitting member 13 made of an insulating material, an electric signal for controlling the Fabry-Perot interference filter 10 does not flow in the light transmitting member 13, and thus the Fabry-Perot interference filter 10 can be controlled with a high accuracy. The above configuration that can prevent contact between the wires 12 and the package 2 is important.

Furthermore, in the light detection device 1A, a silicon substrate is adopted as the substrate 21 of the Fabry-Perot interference filter 10, and an InGaAs substrate formed with a photoelectric conversion region is adopted as the light detector 8, whereby the following actions and effects are achieved. The light detector 8 having the InGaAs substrate formed with the photoelectric conversion region has a high sensitivity to light having a wavelength within a range between 1200 nm and 2100 nm, for example, as compared to light having a wavelength shorter than 1200 nm and light having a wavelength longer than 2100 nm. However, the light detector 8 has a high sensitivity to light having a wavelength shorter than 1200 nm as compared with light having a wavelength longer than 2100 nm. Meanwhile, the silicon substrate has a higher absorptivity to light having a wavelength shorter than 1200 nm as compared with light having a wavelength of 1200 nm or more (although this depends on a manufacturing method, the thickness, and an impurity concentration of the silicon substrate, a high absorptivity is exhibited especially for light having a wavelength shorter than 1100 nm). Therefore, with the above configuration, for example in a case where light having a wavelength within the range between 1200 nm and 2100 nm should be detected, the silicon substrate of the Fabry-Perot interference filter 10 can be caused to function as a high-pass filter. As a result, it is possible to securely suppress detection of noise light (light having a wavelength shorter than 1200 nm (in particular, shorter than 1100 nm) and light having a wavelength longer than 2100 nm) by the light detector 8 by the synergistic effect with the band pass filter 14.

Second Embodiment

[Configuration of Light Detection Device]

Figure 5:
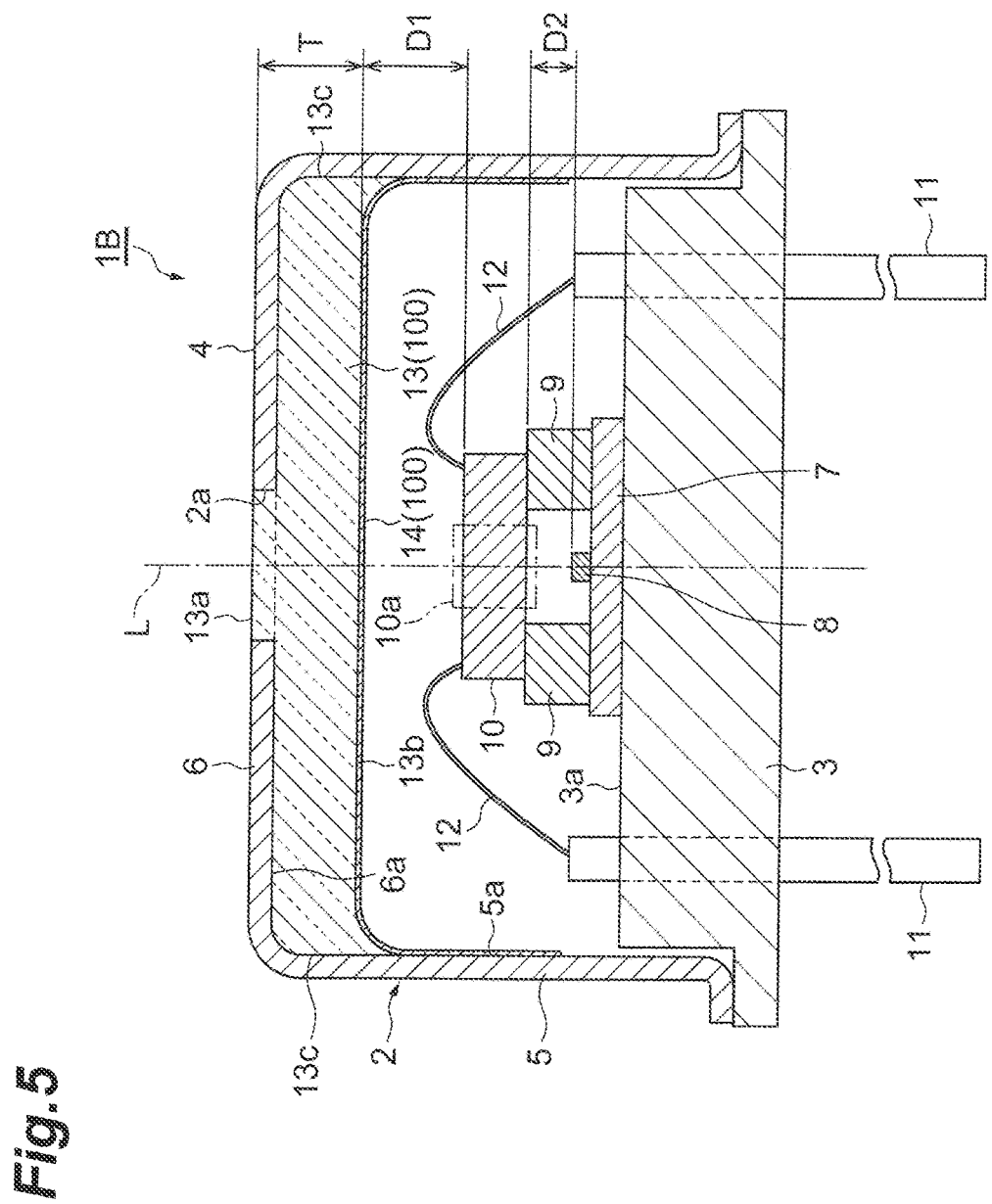
FIG. 5 is a cross-sectional view of a light detection device of a second embodiment.

As illustrated in FIG. 5, a light detection device 1B is different from the light detection device 1A described above in configurations of a light transmitting member 13 and a band pass filter 14. In the light detection device 11, a light transmitting member 13 arranged on an inner surface of a package 2 extends to the inside the opening 2a and an inner surface 5a of a side wall 5. A light incident surface 13a of the light transmitting member 13 is substantially flush with an outer surface of a top wall 6 at the opening 2a. Such a light transmitting member 13 is formed by arranging a glass pellet inside a cap 4 with the opening 2a facing down and melting the glass pellet. That is, the light transmitting member 13 is made of fused glass. A band pass filter 14 extends to a part of the inner surface 5a of the side wall 5 of the cap 4 from a light emitting surface 13b of the light transmitting member 13.

In the light detection device 1B as well, like in the light detection device 1A as described above, the light transmitting member 13 and the band pass filter 14 form the light transmitting unit 100. That is, the light transmitting unit 100 includes the band pass filter 14 that transmits light incident on the light transmission region 10a of the Fabry-Perot interference filter 10.

Also in the light detection device 1B, the thickness T of the light transmitting member 13 is a value larger than or equal to a value obtained by multiplying the distance D1 between the Fabry-Perot interference filter 10 and the light transmitting member 13 by 0.5. Moreover, the thickness T of the light transmitting member 13 is larger than or equal to a distance D2 between the Fabry-Perot interference filter 10 and the light detector 8.

Furthermore, an outer edge of the light transmission region 10a of the Fabry-Perot interference filter 10 is positioned outside an outer edge of the light detector 8. The outer edge of the opening 2a is positioned outside the outer edge of the light transmission region 10a of the Fabry-Perot interference filter 10. The outer edge of the band pass filter 14 is positioned outside the outer edge of the opening 2a. The outer edge of the Fabry-Perot interference filter 10 is positioned outside the outer edge of the opening 2a. The outer edge of the Fabry-Perot interference filter 10 is positioned outside the outer edge of the light detector 8. The outer edge of the band pass filter 14 is positioned outside the outer edge of the Fabry-Perot interference filter 10. The outer edge of the light transmitting member 13 is positioned outside the outer edge of the Fabry-Perot interference filter 10.

[Actions and Effects]

Similar actions and effects as those of the light detection device 1A described above are also achieved by the light detection device 11. Particularly, since the side surfaces 13c of the light transmitting member 13 extends to the inner surface 5a of the side wall 5, it is possible to further securely suppress light from entering the package 2 via the side surfaces 13c of the light transmitting member 13 due to an incident angle of light at the opening 2a, diffraction at the opening 2a, etc. and becoming stray light. Furthermore, since the heat capacity of the light transmitting member 13 and a thermally connected area between the light transmitting member 13 and the package 2 are increased, the temperature inside the package 2 can be further uniformized as a result.

Moreover, in the light detection device 1B, since the volume (particularly the thickness T) of the light transmitting member 13 is large, flatness of the light incident surface 13a and the light emitting surface 13b of the light transmitting member 13 made of fused glass can be improved. Furthermore, even if air bubbles generated at the time of formation remain in the light transmitting member 13 made of fused glass, since the volume (particularly the thickness T) of the light transmitting member 13 is large, it is possible to reduce the influence of the air bubbles.

Figure 6:
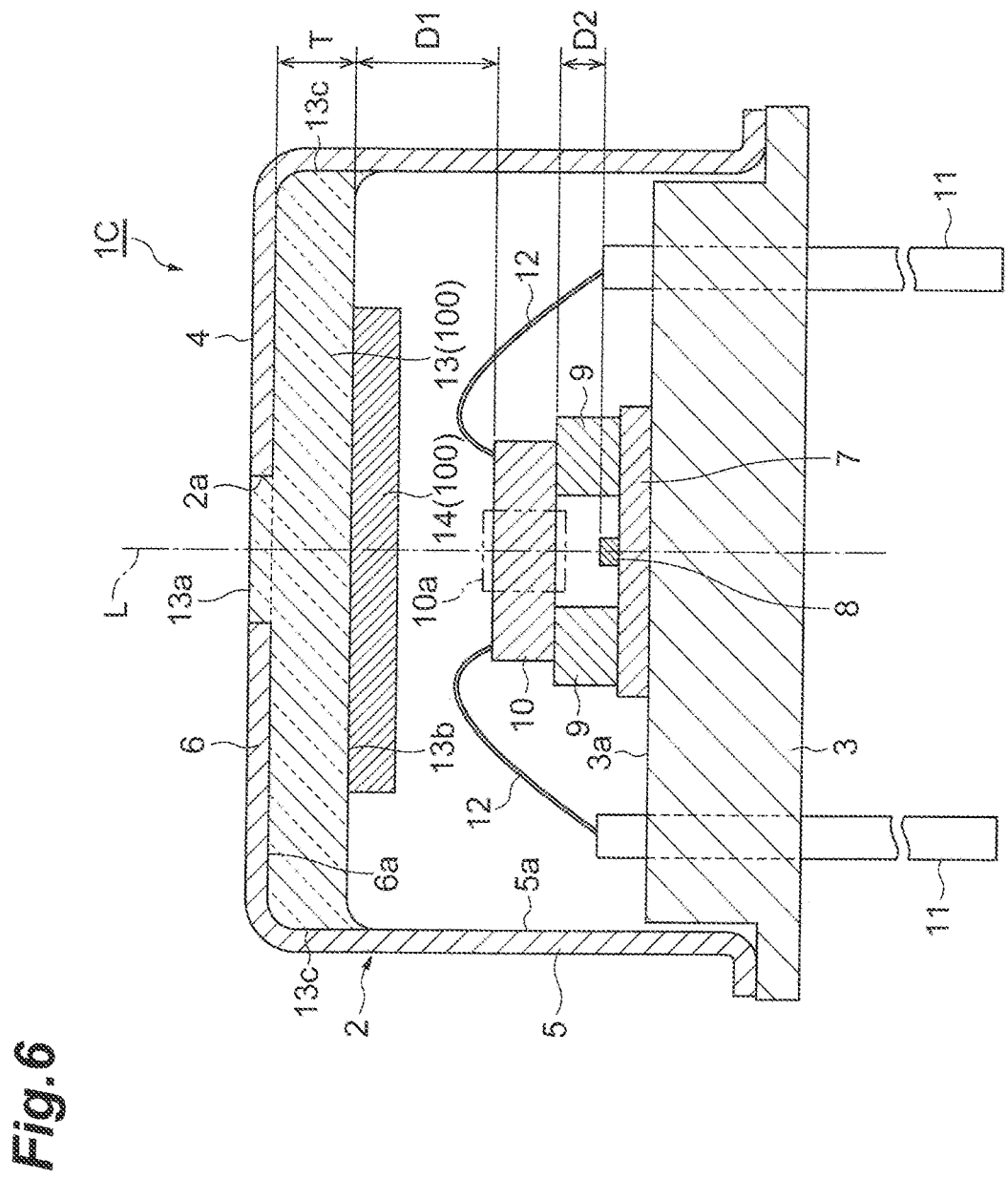
FIG. 6 is a cross-sectional view of a modification of the light detection device of the second embodiment.

Note that, as in a light detection device 1C illustrated in FIG. 6, a band pass filter 14 of a plate shape may be attached to a light emitting surface 13b of the light transmitting member 13 by an adhesive agent or other means. The band pass filter 14 of a plate shape is a light transmitting member made of, for example, silicon, glass, or other materials with a dielectric multilayer film formed on a surface thereof. The flatness of the light emitting surface 13b is improved in the light transmitting member 13 made of fused glass since the thickness T is large, and thus the band pass filter 14 can be suitably arranged on the light emitting surface 13b. According to the light detection device 1C, since the heat capacity is increased by the band pass filter 14 of a plate shape and the volume of the space in the package 2 is further reduced, the temperature inside the package 2 can be further uniformized. Furthermore, since the distance between the band pass filter 14 and the Fabry-Perot interference filter 10 is reduced by the thickness of the light transmitting member forming the band pass filter 14 of a plate shape, it is further securely ensured that light incident on the light transmission region 10a of the Fabry-Perot interference filter 10 has been transmitted through the band pass filter 14.

In the light detection device 1C as well, like in the light detection device 1A as described above, the light transmitting member 13 and the band pass filter 14 form a light transmitting unit 100. That is, the light transmitting unit 100 includes the band pass filter 14 that transmits light incident on the light transmission region 10a of the Fabry-Perot interference filter 10.

[Modifications]

Although the first embodiment and the second embodiment of the present disclosure have been described above, one embodiment of the present disclosure is not limited to the first embodiment or the second embodiment described above. For example, the materials and the shapes of the respective configurations are not limited to the aforementioned materials or shapes but may employ various materials or shapes.

Moreover, the band pass filter 14 may be provided on the light incident surface 13a of the light transmitting member 13 or may be provided on both the light incident surface 13a and the light emitting surface 13b of the light transmitting member 13. As an example, as the light detection device 1B illustrated in FIG. 5, the band pass filter 14 may be provided on the light incident surface 13a of the light transmitting member 13 which is substantially flush with the outer surface of the top wall 6 at the opening 2a.

Furthermore, the Fabry-Perot interference filter 10 may not include the laminated structure (the antireflection layer 41, the third laminated body 42, the intermediate layer 43, the fourth laminated body 44, the light shielding layer 45, and the protective layer 46) provided on the light emitting side surface 21b of the substrate 21.

When viewed from a direction parallel to the line L, the outer edge of the light transmission region 10a of the Fabry-Perot interference filter 10 may be positioned outside the outer edge of the opening 2a. In this case, the ratio of light entering the light transmission region 10a out of light incident from the opening 2a increases, and the utilization efficiency of light incident from the opening 2a increases. Moreover, even if the position of the opening 2a with respect to the light transmission region 10a is shifted to some extent, since light incident from the opening 2a enters the light transmission region 10a, requirement of positional accuracy at the time of assembling the light detection devices 1A, 1B, and 1C is relaxed.

Third Embodiment

[Configuration of Light Detection Device]

Figure 7:
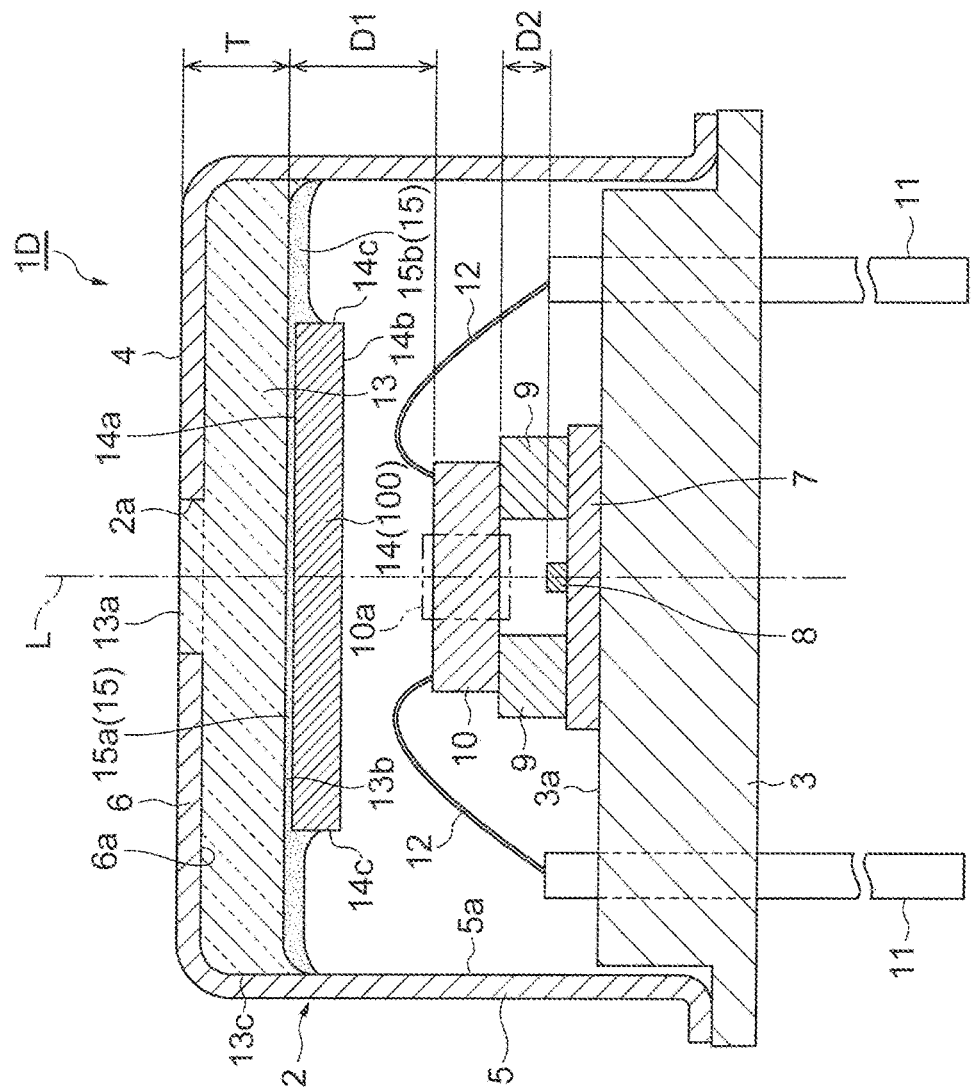
FIG. 7 is a cross-sectional view of a light detection device according to a third embodiment.

As illustrated in FIG. 7, a light detection device 1D includes a package 2. The package 2 is a CAN package having a stem (second wall part) 3 and a cap 4. The cap 4 is integrally formed by a side wall (side wall part) 5 and a top wall (first wall part) 6. The stem 3 and the cap 4 are made of a metal material and are airtightly joined to each other. In the package 2 formed of a metal material, the side wall 5 has a cylindrical shape having a predetermined line L as a center line thereof. The stem 3 and the top wall 6 face each other in a direction parallel to the line L and close each of both ends of the side wall 5.

On an inner surface 3a of the stem 3, a wiring substrate 7 is fixed. As a material of the wiring substrate 7, for example, silicon, ceramic, quartz, glass, plastic, or other materials can be used. On the wiring substrate 7, a temperature compensating element (not illustrated) such as a light detector 8 and a thermistor is mounted. The light detector 8 is arranged on the line L. More specifically, the light detector 8 is arranged such that the center line of a light receiving unit thereof coincides with the line L. The light detector 8 is an infrared detector such as a quantum type sensor using InGaAs or other compounds or a thermal type sensor using a thermopile or a bolometer or other instruments. In a case where light of different wavelength regions of ultraviolet, visible, and near infrared regions, for example a silicon photodiode or other components can be used as the light detector 8. Note that the light detector 8 may include one light receiving unit or may include a plurality of light receiving units in an arrayed shape. Furthermore, a plurality of light detectors 8 may be mounted on the wiring substrate 7.

On the wiring substrate 7, a plurality of spacers 9 are fixed. As a material of the spacers 9, for example, silicon, ceramic, quartz, glass, plastic, or other materials can be used. On the plurality of spacers 9, a Fabry-Perot interference filter 10 is fixed by, for example, an adhesive agent. The Fabry-Perot interference filter 10 is arranged on the line L. More specifically, the Fabry-Perot interference filter 10 is arranged such that the center line of a light transmission region 10a coincides with the line L. Note that the spacers 9 may be integrally formed with the wiring substrate 7. The Fabry-Perot interference filter 10 may be supported not by the plurality of spacers 9 but by one spacer 9.

A plurality of lead pins 11 are fixed to the stem 3. More specifically, each of the lead pins 11 penetrates through the stem 3 in a state where electrical insulation and airtightness with the stem 3 is maintained. Electrode pads provided on the wiring substrate 7, terminals of the light detector 8, terminals of the temperature compensating element, and terminals of the Fabry-Perot interference filter 10 are electrically connected to the respective lead pins 11 by wires 12. This enables input and output of electric signals to and from each of the light detector 8, the temperature compensating element, and the Fabry-Perot interference filter 10.

An opening (light incident opening) 2a is formed in the package 2. More specifically, the opening 2a is formed in the top wall 6 of the cap 4 such that the center line thereof coincides with the line L. When viewed from a direction parallel to the line L, the opening 2a has circular shape. On an inner surface 6a of the top wall 6, a light transmitting member 13 is arranged so as to close the opening 2a. The light transmitting member 13 is airtightly joined to the inner surface 6a of the top wall 6. The light transmitting member 13 has a light incident surface 13a and a light emitting surface (inner surface) 13b facing each other in a direction parallel to the line L and a side surface 13c A light incident surface 13a of the light transmitting member 13 is substantially flush with an outer surface of a top wall 6 at the opening 2a. The side surface 13c of the light transmitting member 13 is in contact with an inner surface 5a of the side wall 5 of the package 2. That is, the light transmitting member 13 extends to the inside of the opening 2a and the inner surface 5a of the side wall 5. Such a light transmitting member 13 is formed by arranging a glass pellet inside a cap 4 with the opening 2a facing down and melting the glass pellet. In other words, the light transmitting member 13 is formed of fused glass.

A band pass filter 14 is fixed to the light emitting surface 13b of the light transmitting member 13 by a bonding member 15. That is, the bonding member 15 fixes the band pass filter 14 on the inner surface 6a of the top wall 6 via the light transmitting member 13 joined to the inner surface 6a of the top wall 6. the band pass filter 14 selectively transmits light in a range of measurement wavelengths (light in a predetermined wavelength range and incident on the light transmission region 10a of the Fabry-Perot interference filter 10) of the light detection device 1D out of light transmitted through the light transmitting member 13 (that is, only light in the wavelength range is transmitted). The band pass filter 14 has a rectangular plate shape. More specifically, the band pass filter 14 has a light incident surface 14a and a light emitting surface 14b facing each other in a direction parallel to the line L and four side surfaces 14c. The band pass filter 14 is a light transmitting member formed into a rectangular plate shape from a light transmitting material (for example, silicon, glass, etc.) with a dielectric multilayer film (multilayer film formed by a combination of a high refractive material such as $TiO_2$ and $Ta_2O_5$ and a low refractive material such as $SiO_2$ and $MgF_2$) formed thereon.

In the light detection device 1D, the light transmitting unit 100 is formed by the band pass filter 14. That is, the light transmitting unit 100 includes the band pass filter 14 that transmits light incident on the light transmission region 10a of the Fabry-Perot interference filter 10.

Figure 8:
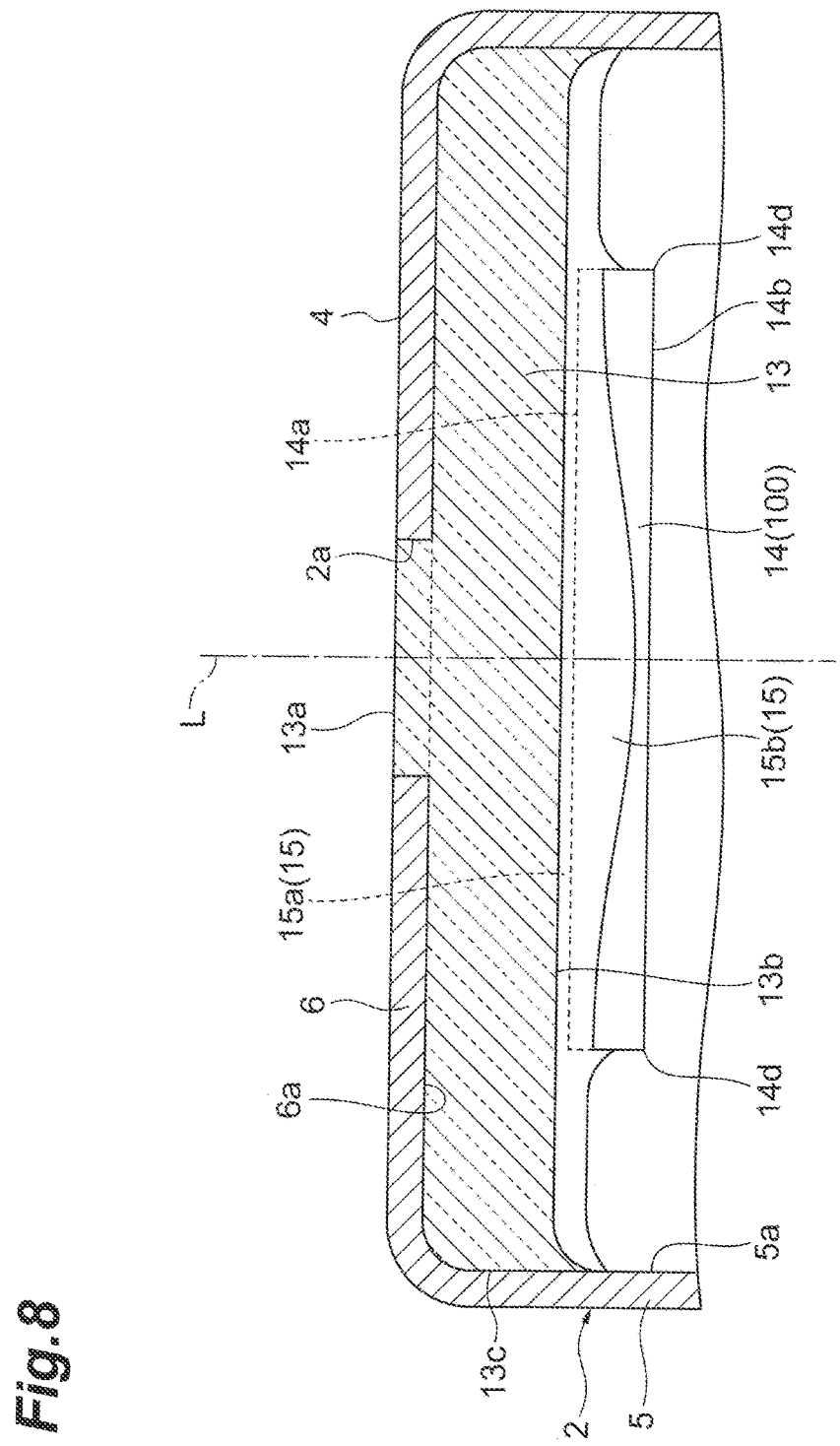
FIG. 8 is an enlarged view of a part of the light detection device of FIG. 7.

The bonding member 15 has a first part 15a arranged over the entire region of the light incident surface 14a of the band pass filter 14. That is, the first part 15a is a part of the bonding member 15 arranged between the light emitting surface 13b of the light transmitting member 13 and the light incident surface 14a of the band pass filter 14 facing each other. Furthermore, the bonding member 15 has a second part 15b protruding outward from the outer edge of the band pass filter 14 when viewed from a direction parallel to the line L. The second part 15b extends to the inner surface 5a of the side wall 5 and is in contact with the inner surface 5a of the side wall 5. The second part 15b is in contact with the side surfaces 14c of the band pass filter 14. As illustrated in FIG. 8, the thickness of the second part 15b in a direction parallel to the line L is the maximum at a part in contact with the central part of each of the side surfaces 14c and is the minimum at a part in contact with each of the corner parts 14d of the band pass filter 14 (corner parts formed by adjacent side surfaces 14c). However, in a case where the thickness of the second part 15b in the direction parallel to the line L is gradually reduced at each of the corner parts 14d than at the central part of each of the side surfaces 14c for example due to a convex curved surface of the second part 15b, the thickness of the second part 15b may not be the minimum at a part in contact with each of the corner parts 14d. Occurrence of a crack in a corner part 14d of the band pass filter 14 can be suppressed unless the thickness of the second part 15b is maximized at a part in contact with the respective corner parts 14d. As a material of the bonding member 15, a light transmitting material (for example, light transmitting resin, low melting point glass, etc.) can be used. Note that, in FIG. 8, for convenience of explanation, only the package 2 and the light transmitting member 13 are illustrated in cross section.

As illustrated in FIG. 7, in the light detection device 1D, the package 2 accommodates the wiring substrate 7, the light detector 8, the temperature compensating element (not illustrated), the plurality of spacers 9, the Fabry-Perot interference filter 10, and the band pass filter 14. In the light detection device 1D, the opening 2a, the light transmitting member 13, and the band pass filter 14 are arranged on one side (second side) of the Fabry-Perot interference filter 10 on the line L, and the light detector 8 is arranged on the other side (first side) of the Fabry-Perot interference filter 10 on the line L. Furthermore, in the light detection device 1D, the stem 3 faces the top wall 6 of the cap 4 with the Fabry-Perot interference filter 10, the band pass filter 14, and the light detector 8 interposed therebetween, and the side wall 5 of the cap 4 surrounds the Fabry-Perot interference filter 10, the band pass filter 14, and light detector 8.

A thickness T of the light transmitting member 13 (thickness in a direction parallel to the line L, which is a distance between the light incident surface 13a and the light emitting surface 13b) is greater than or equal to a value obtained by multiplying a distance D1 between the Fabry-Perot interference filter 10 and the light transmitting member 13 (distance between a surface of the Fabry-Perot interference filter 10 on the light transmitting member 13 side and the light emitting surface 13b of the light transmitting member 13) by 0.3. Moreover, the thickness T of the light transmitting member 13 is greater than or equal to a distance D2 between the Fabry-Perot interference filter 10 and the light detector 8 (distance between a surface of the Fabry-Perot interference filter 10 on the light detector 8 side and a surface of the light detector 8 on the Fabry-Perot interference filter 10 side).

Figure 9:
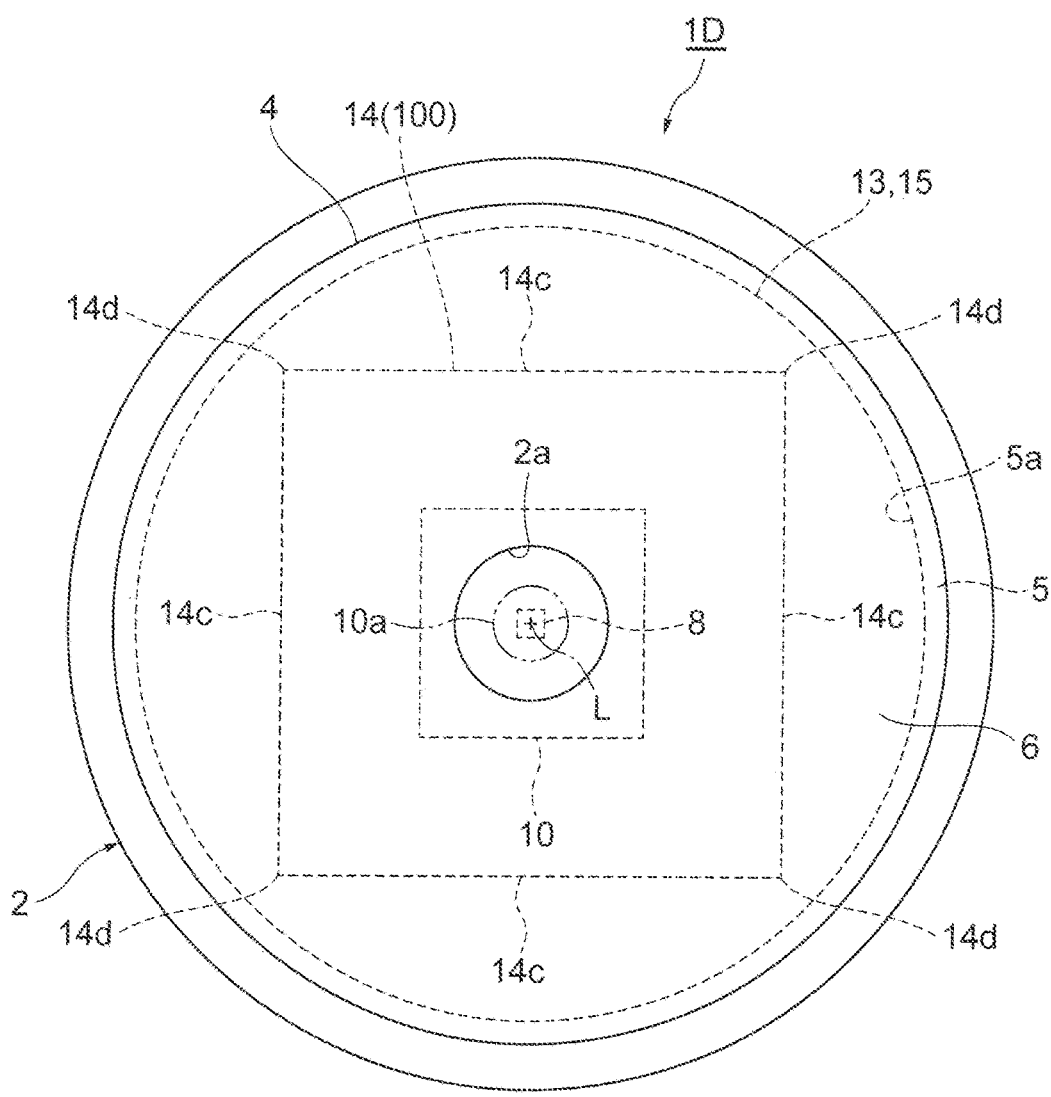
FIG. 9 is a plan view of the light detection device of FIG. 7.

The positional relationship and sizes of the respective components when viewed from a direction parallel to the line L are as follows. As illustrated in FIG. 9, the center line of the opening 2a, the center line of the light transmitting member 13, the center line of the band pass filter 14, the center line of the light transmission region 10a of the Fabry-Perot interference filter 10, and the center line of the light receiving unit of the light detector 8 coincides with the line L. Outer edges of the opening 2a, the light transmitting member 13, the bonding member 15, and the light transmission region 10a of the Fabry-Perot interference filter 10 have a circular shape. Outer edges of the band pass filter 14, the Fabry-Perot interference filter 10, and the light detector 8 have a rectangular shape.

The outer edge of the light transmission region 10a of the Fabry-Perot interference filter 10 is positioned outside the outer edge of the light detector 8. The outer edge of the opening 2a is positioned outside the outer edge of the light transmission region 10a of the Fabry-Perot interference filter 10. The outer edge of the Fabry-Perot interference filter 10 is positioned outside the outer edge of the opening 2a. The outer edge of the band pass filter 14 is positioned outside the outer edge of the Fabry-Perot interference filter 10. The outer edge of each of the light transmitting member 13 and the bonding member 15 is positioned outside the outer edge of the band pass filter 14 and coincides with the inner surface 5a of the side wall 5 of the cap 4. Note that "one outer edge is positioned outside another outer edge when viewed from a predetermined direction" means that "the outer edge surrounds the other outer edge when viewed from the predetermined direction" or that "the outer edge includes the other outer edge when viewed from the predetermined direction".

In the light detection device 1D configured as described above, when light enters the band pass filter 14 from the outside via the opening 2a, the light transmitting member 13, and the bonding member 15, light in a predetermined wavelength range is selectively transmitted. When the light transmitted through the band pass filter 14 is incident on the light transmission region 10a of the Fabry-Perot interference filter 10, light having a predetermined wavelength out of light within the predetermined wavelength range is selectively transmitted. The light transmitted through the light transmission region 10a of the Fabry-Perot interference filter 10 enters the light receiving unit of the light detector 8 and is detected by the light detector 8.

[Configuration of Fabry-Perot Interference Filter]

Figure 10:
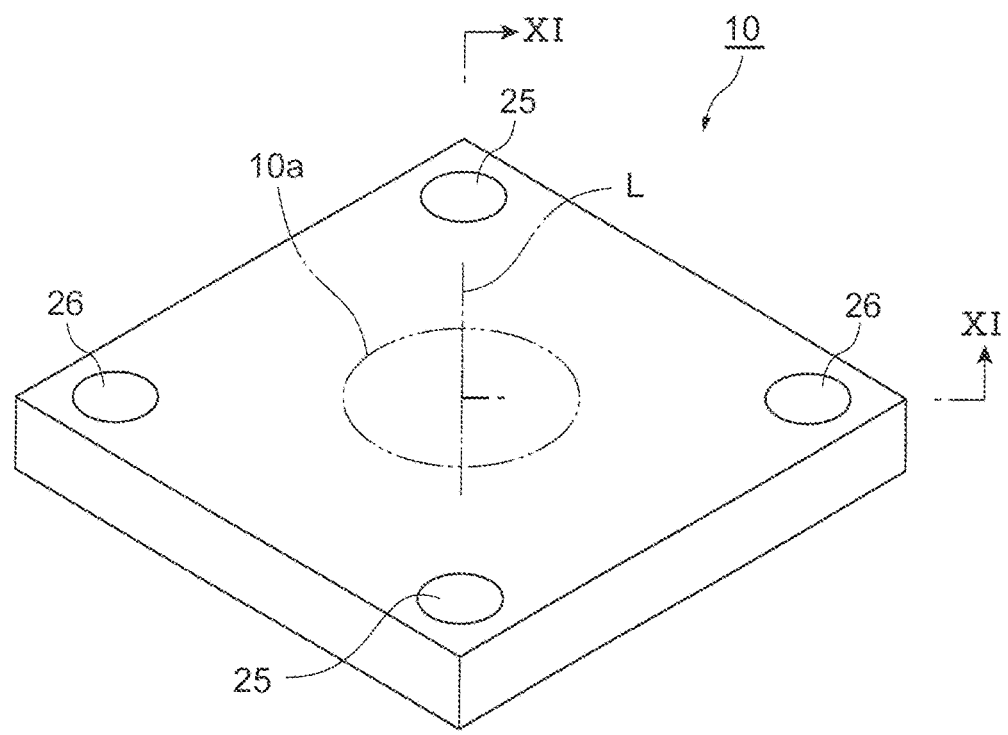
FIG. 10 is a perspective view of a Fabry-Perot interference filter of the light detection device of FIG. 7.

As illustrated in FIG. 10, in the Fabry-Perot interference filter 10, a light transmission region 10a that transmits light corresponding to the distance between a first mirror and a second mirror is included on the line L. In the light transmission region 10a, the distance between the first mirror and the second mirror is controlled with an extremely high accuracy. That is, in the Fabry-Perot interference filter 10, the light transmission region 10a is a region in which the distance between the first mirror and the second mirror can be controlled to a predetermined distance in order to selectively transmit light having a predetermined wavelength and is a region through which light having a predetermined wavelength corresponding to the distance between the first mirror and the second mirror can be transmitted.

Figure 11:
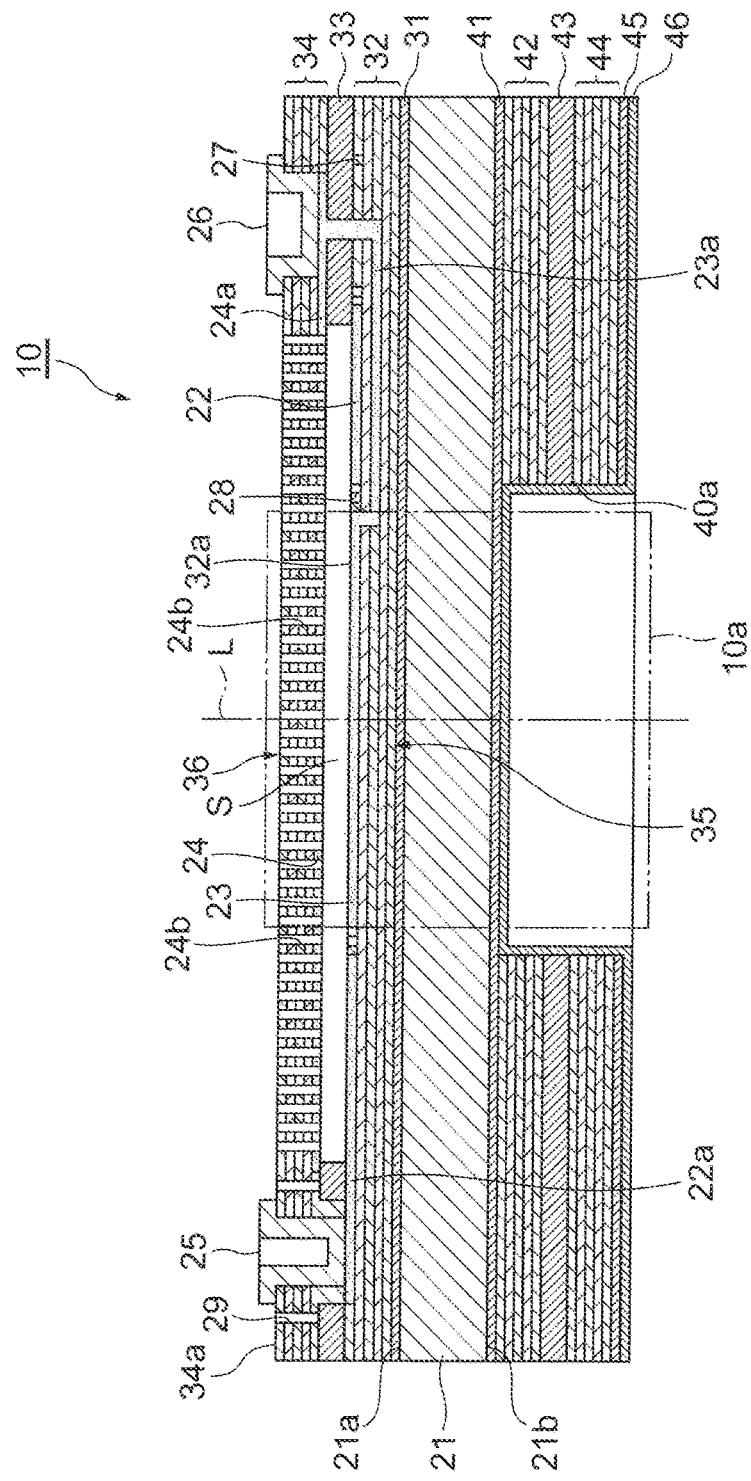
FIG. 11 is a cross-sectional view of the Fabry-Perot interference filter taken along line XI-XI in FIG. 10.

As illustrated in FIG. 11, the Fabry-Perot interference filter 10 includes a substrate 21. On a surface 21a of the substrate 21 on a light incident side, an antireflection layer 31, a first laminated body 32, an intermediate layer 33, and a second laminated body 34 are laminated in the order mentioned. A gap (air gap) S is formed between the first laminated body 32 and the second laminated body 34 by the intermediate layer 33 of a frame shape. The substrate 21 is made of, for example, silicon, quartz, glass, or other materials. In a case where the substrate 21 is made of silicon, the antireflection layer 31 and the intermediate layer 33 are made of, for example, silicon oxide. The thickness of the intermediate layer 33 may be an integral multiple obtained by multiplying the central transmission wavelength (that is, the central wavelength of a wavelength range that the Fabry-Perot interference filter 10 can transmit) by ½.

A part of the first laminated body 32 corresponding to the light transmission region 10a functions as a first mirror 35. The first mirror 35 is supported on the substrate 21 via the antireflection layer 31. The first laminated body 32 includes a plurality of polysilicon layers and a plurality of silicon nitride layers with each of the plurality of layers laminated alternately. The optical thickness of each of the polysilicon layers and the silicon nitride layers forming the first mirror 35 may be an integral multiple obtained by multiplying the central transmission wavelength by ¼. Note that a silicon oxide layer may be used instead of the silicon nitride layer.

A part of the second laminated body 34 corresponding to the light transmission region 10a functions as a second mirror 36 facing the first mirror 35 via the gap S. The second mirror 36 is supported on the substrate 21 via the antireflection layer 31, the first laminated body 32, and the intermediate layer 33. The second laminated body 34 includes a plurality of polysilicon layers and a plurality of silicon nitride layers with each of the plurality of layers laminated alternately. The optical thickness of each of the polysilicon layers and the silicon nitride layers forming the second mirror 36 may be an integral multiple obtained by multiplying the central transmission wavelength by ¼. Note that a silicon oxide layer may be used instead of the silicon nitride layer.

In a part of the second laminated body 34 corresponding to the gap S, a plurality of through holes 24b extending from a surface 34a of the second laminated body 34 to the gap S is included. The plurality of through holes 24b is formed to an extent that they do not substantially affect the function of the second mirror 36. The plurality of through holes 24b have been used to form the gap S by removing a part of the intermediate layer 33 by etching.

In the first mirror 35, a first electrode 22 is formed so as to surround the light transmission region 10s. In the first mirror 35, a second electrode 23 is formed so as to include the light transmission region 10a. The first electrode 22 and the second electrode 23 are formed by doping the polysilicon layer with an impurity to reduce the resistance. The size of the second electrode 23 is substantially the same as the size of the light transmission region 10a.

On the second mirror 36, a third electrode 24 is formed. The third electrode 24 faces the first electrode 22 and the second electrode 23 via the gap S in a direction parallel to the line L. The third electrode 24 is formed by doping the polysilicon layer with an impurity to reduce the resistance.

In the Fabry-Perot interference filter 10, the second electrode 23 is positioned on the same plane as that of the first electrode 22 in a direction parallel to the line L. The distance between the second electrode 23 and the third electrode 24 is the same as the distance between the first electrode 22 and the third electrode 24. Furthermore, when viewed from a direction parallel to the line L, the second electrode 23 is surrounded by the first electrode 22.

A pair of terminals 25 are provided so as to face each other while interposing the light transmission region 10a. Each of the terminals 25 is arranged in a through hole extending from a surface 34a of the second laminated body 34 to the first laminated body 32. Each of the terminals 25 is electrically connected to the first electrode 22 via wiring 22a.

A pair of terminals 26 are provided so as to face each other while interposing the light transmission region 10a. Each of the terminals 26 is arranged in a through hole extending from the surface 34a of the second laminated body 34 to a layer before the intermediate layer 33. Each of the terminals 26 is electrically connected to the second electrode 23 via wiring 23a and is also electrically connected to the third electrode 24 via wiring 24a. Note that, a direction in which the pair of terminals 25 face each other and a direction in which the pair of terminals 26 face each other are perpendicular to each other (see FIG. 10).

Trenches 27 and 28 are included on the surface 32a of the first laminated body 32. The trench 27 extends annularly so as to surround a connected part of the wiring 23a, with the terminal 26, extending from the terminal 26 along the direction parallel to the line L. The trench 27 electrically insulates the first electrode 22 from the wiring 23a. A trench 28 annularly extends along the inner edge of the first electrode 22. The trench 28 electrically insulates the first electrode 22 from the second electrode 23. Regions inside the trenches 27 and 28 may be made of an insulating material or void.

Trenches 29 are included on the surface 34a of the second laminated body 34. A trench 29 annularly extends so as to surround a terminal 25. The trench 29 electrically insulates the terminal 25 from the third electrode 24. A region inside the trench 28 may be made of an insulating material or void.

On a surface 21b of the substrate 21 on a light emitting side, an antireflection layer 41, a third laminated body 42, an intermediate layer 43, and a fourth laminated body 44 are laminated in the order mentioned. The antireflection layer 41 and the intermediate layer 43 have a similar configuration to those of the antireflection layer 31 and the intermediate layer 33, respectively. The third laminated body 42 and the fourth laminated body 44 have lamination configurations symmetrical to those of the first laminated body 32 and the second laminated body 34, respectively, with respect to the substrate 21. The antireflection layer 41, the third laminated body 42, the intermediate layer 43, and the fourth laminated body 44 have a function of suppressing warping of the substrate 21.

The antireflection layer 41, the third laminated body 42, the intermediate layer 43, and the fourth laminated body 44 include an opening 40a so as to include the light transmission region 10a. The opening 40a has substantially the same diameter as the size of the light transmission region 10a. The opening 40a is open on the light emitting side while a bottom surface of the opening 40a reaches the antireflection layer 41. A light shielding layer 45 is formed on a surface of the fourth laminated body 44 on the light emitting side. The light shielding layer 45 is made of, for example, aluminum. A protective layer 46 is formed on a surface of the light shielding layer 45 and an inner surface of the opening 40a. The protective layer 46 is made of, for example, aluminum oxide. Note that, by setting the thickness of the protective layer 46 at 1 to 100 nm (preferably, about 30 nm), optical influence by the protective layer 46 can be negligible.

In the Fabry-Perot interference filter 10 configured in the above manner, when a voltage is applied between the first electrode 22 and the third electrode 24 via the respective terminals 25 and 26, electrostatic force corresponding to the voltage is generated between the first electrode 22 and the third electrode 24. Due to the electrostatic force, the second mirror 36 is attracted to the side of the first mirror 35 fixed to the substrate 21, and the distance between the first mirror 35 and the second mirror 36 is adjusted. As described above, in the Fabry-Perot interference filter 10, the distance between the first mirror 35 and the second mirror 36 is allowed to be variable.

The wavelength of light transmitted through the Fabry-Perot interference filter 10 depends on the distance between the first mirror 35 and the second mirror 36 in the light transmission region 10a. Therefore, by adjusting the voltage applied between the first electrode 22 and the third electrode 24, a wavelength of transmitted light can be selected as appropriate. At this time, the second electrode 23 has the same potential as that of the third electrode 24. Therefore, the second electrode 23 functions as a compensation electrode for keeping the first mirror 35 and the second mirror 36 flat in the light transmission region 10a.

The light detection device 1D can obtain an optical spectrum by detecting light transmitted through the light transmission region 10a of the Fabry-Perot interference filter 10 by the light detector 8 while changing the voltage applied to the Fabry-Perot interference filter 10 (that is, changing the distance between the first mirror 35 and the second mirror 36 in the Fabry-Perot interference filter 10).

[Actions and Effects]

As described above, in the light detection device 1D, the side wall 5 of the package 2 has a cylindrical shape while the band pass filter 14 has a rectangular plate shape. As a result, the distance between each of the corner parts 14d of the band pass filter 14 and the inner surface 5a of the side wall 5 becomes smaller than the distance between each of the side surfaces 14c of the band pass filter 14 and the inner surface 5a of the side wall 5. Therefore, the band pass filter 14 fixed on the inner surface 6a of the top wall 6 of the package 2 is positioned by each of the corner parts 14d thereof with a high accuracy. Here, for example in a case where the band pass filter 14 has a circular plate shape, if the diameter of the band pass filter 14 is increased such that the distance between a side surface 14c of the band pass filter 14 and the inner surface 5a of a side wall 5 becomes smaller in order to implement high-precision positioning of the band pass filter 14, the following problem occurs. That is, since an area of the light incident surface 14a of the band pass filter 14 thermally connected to the inner surface 6a of the top wall 6 of the package 2 is increased, the band pass filter 14 is easily affected by heat (deformation or other disadvantages due to heat) from the package 2. On the other hand, if the band pass filter 14 has a rectangular plate shape, an area of the light incident surface 14a of the band pass filter 14 thermally connected to the inner surface 6a of the top wall 6 of the package 2 becomes smaller, for example as compared to the case where the band pass filter 14 has a circular plate shape, and thus the band pass filter 14 is less likely to be affected by heat from the package 2. Furthermore, since the outer edge of the Fabry-Perot interference filter 10 is positioned outside the outer edge of the opening 2a and the outer edge of the band pass filter 14 is positioned outside the outer edge of the Fabry-Perot interference filter 10, it is ensured that light incident on the light transmission region 10a of the Fabry-Perot interference filter 10 has been transmitted through the band pass filter 14. As described above, according to the light detection device 1D, the band pass filter 14 can function properly.

Here, the importance of allowing the band pass filter 14 to appropriately function in the light detection device 1D including the Fabry-Perot interference filter 10 will be described. In the Fabry-Perot interference filter 10, a wavelength $\lambda$ that satisfies $\lambda=2nd/a$ (n: refractive index, d: distance between the first mirror 35 and the second mirror 36, a: integer) is a peak wavelength of the light transmitted through the light transmission region 10a. Even with the same distance d, if a value of the integer a is increased (brought to a higher order side), a peak wavelength corresponding thereto appears on a shorter wavelength side. Therefore, in the light detection device 1D, in addition to the Fabry-Perot interference filter 10, the band pass filter 14 that cuts off light (especially light on the short wavelength side) outside a predetermined wavelength range is required.

For example, in a light detection device for obtaining an optical spectrum of second-order light (a=2), it is necessary to cut off multi-order light of an order higher than or equal to three appearing particularly on the shorter wavelength side. Furthermore, a case is assumed where an InGaAs PIN photodiode (single element photodiode) is used in the light detector 8 and reasonable white light (halogen lamp etc.) is used as a light source. Therefore, it is necessary to arrange the band pass filter 14 at a position on the optical axis of the light source/light detector 8. When the light detection device including the band pass filter 14 and the light detection device not including the band pass filter 14 are compared, it is confirmed that in the light detection device including the band pass filter 14, high order light on the shorter wavelength side has cut off.

As described above, since the light detection device 1D includes the band pass filter 14, it is possible to provide the light detection device 1D as a general product with high completeness which does not require customization of the Fabry-Perot interference filter 10. Furthermore, since a single element photodiode can be used as the light detector 8, the manufacturing cost of the light detection device 1D can be reduced.

Next, advantages of the cylindrical shape of the side wall 5 of the package 2 will be described. First, in the light detection device 1D, since the side wall 5 of the package 2 has a cylindrical shape, durability of the light detection device 1D is improved. More specifically, since the side wall 5 of the package 2 has a cylindrical shape, stability of the shape of the package 2 is higher than, for example, the case where the side wall 5 of the package 2 has a polygonal cylindrical shape.

Moreover, in the light detection device 1D, since the side wall 5 of the package 2 has a cylindrical shape, stress is unlikely to be concentrated for example as compared with the case where the package 2 has a polygonal shape. This is because stress due to an impact is not concentrated on one point but is dispersed in the case where the side wall 5 of the package 2 has a cylindrical shape contrary to the case where the package 2 has a polygonal tubular shape, and stress due to an impact applied to the package 2 is likely to concentrate on the corner parts. In particular, the Fabry-Perot interference filter 10 accommodated in the package 2 is vulnerable to a physical impact. Therefore, by allowing the side wall 5 of the package 2 to have a cylindrical shape, the Fabry-Perot interference filter 10 is suitably protected from an external physical impact.

Moreover, there are cases where a thermal stress is generated in the package 2 depending on thermal history at the time of assembling the light detection device 1D (thermally curing the bonding member 15, connecting the wires 12, sealing by the stem 3, etc.), temperature change after assembling, or other reasons. The thermal stress is generated by a difference in coefficient of linear thermal expansion among the members forming the light detection device 1D. It is desirable to avoid that this thermal stress is concentrated and accumulated in a specific location or in a specific direction in the light detection device 1D. This is because if a thermal stress concentrates in a specific location or in a specific direction, this leads to characteristic abnormality or breakage of the light detection device 1D. In the light detection device 1D, since the side wall 5 of the package 2 has a cylindrical shape, a generated thermal stress is dispersed without concentrating on one point. As a result, occurrence of characteristic abnormality in the light detection device 1D or breakage of the light detection device 1D can be suppressed.

The light detection device 1D further includes the light transmitting member 13 arranged on the inner surface 6a of the top wall 6 so as to close the opening 2a, in which the band pass filter 14 is fixed to the light emitting surface (inner surface) 13b of the light transmitting member 13 by the bonding member 15, and the bonding member 15 is arranged over the entire region of the light incident surface 14a of the band pass filter 14 facing the light emitting surface 13b of the light transmitting member 13. According to this configuration, since the bonding member 15 is arranged over the entire region of the light incident surface 14a of the band pass filter 14, the band pass filter 14 is securely fixed to the inner surface 6a of the top wall 6. Furthermore, even if air bubbles are generated in the bonding member 15 at the time of manufacturing, the air bubbles easily escape from between the side surfaces 14c of the band pass filter 14 and the inner surface 5a of the side wall 5, scattering, diffraction, and the like at the bonding member 15 are suppressed. Furthermore, according to this configuration, since the light transmitting member 13 is provided, airtightness of the package 2 is improved. Furthermore, since the band pass filter 14 is fixed to the light emitting surface 13b of the light transmitting member 13, thermal influence from the package 2 is unlikely to be received. Furthermore, since the band pass filter 14 is fixed to the light emitting surface 13b of the light transmitting member 13, occurrence of a damage, such as a scratch, to the band pass filter 14 due to physical interference from the opening 2a can be prevented.

Here, the effect of suppressing scattering and diffraction of light and the like at the bonding member 15 will be described. There are cases where the light emitting surface 13b of the light transmitting member 13 does not have good flatness and have a curvature. In particular, there are cases where a region of the light emitting surface 13b of the light transmitting member 13 facing the opening 2a is distorted so as to be recessed toward the opening 2a. This is because in this region the light transmitting member 13 is distorted so as to be recessed toward the opening 2a due to the weight of the light transmitting member 13 (which is molten glass) at the time of firing. As a result, it becomes difficult for air bubbles generated in the bonding member 15 at the time of manufacturing to escape from a region of the light emitting surface 13b of the light transmitting member 13 facing the opening 2a, which may disadvantageously cause scattering, unwanted diffraction, and the like of light at the bonding member 15. Furthermore, there are cases where the flatness of the light incident surface 14a of the band pass filter 14 is not good. As a result, disadvantageously, the band pass filter 14 may not be positioned with a high accuracy.

Furthermore, in the light detection device 1D, each of the corner parts 14d of the band pass filter 14 and the inner surface 5a of the side wall 5 are not in contact with each other but are separated from each other. This can prevent breakage of the band pass filter 14 (in particular, each of the corner parts 14d) due to a contact between each of the corner parts 14d and the inner surface 5a of the side wall 5. Furthermore, since each of the corner parts 14d of the band pass filter 14 and the inner surface 5a of the side wall 5 are not in contact with each other but are separated from each other, the band pass filter 14 is less likely to be affected by heat from the package 2. Furthermore, since each of the corner parts 14d of the band pass filter 14 and the inner surface 5a of the side wall 5 are not in contact with each other but are separated from each other, that is, since each of the corner parts 14d of the band pass filter 14 is separated from an R unit (R unit formed by the light emitting surface 13b of the light transmitting member 13 and the inner surface 5a of the side wall 5) of the package 2, the band pass filter 14 is securely fixed to the light emitting surface 13b of the light transmitting member 13 which is a flat surface.

In the light detection device 1D, the side wall 5 of the package 2 has a cylindrical shape while the band pass filter 14 has a rectangular plate shape. As a result, the band pass filter 14 is positioned by each of the corner parts 14d thereof with a high accuracy as described above. Here, for example in a case where the band pass filter 14 has a circular plate shape, if the diameter of the band pass filter 14 is increased such that the distance between a side surface 14c of the band pass filter 14 and the inner surface 5a of a side wall 5 becomes smaller in order to implement high-precision positioning of the band pass filter 14, the following problem occurs. That is, since the area of the light incident surface 14a of the band pass filter 14 fixed to the light emitting surface 13b of the light transmitting member 13 is increased by the bonding member 15, it is becomes difficult for air bubbles generated in the bonding member 15 to be removed therefrom. On the other hand, when the band pass filter 14 has a rectangular plate shape, the area of the light incident surface 14a of the band pass filter 14 fixed on the light emitting surface 13b of the light transmitting member 13 becomes smaller as compared to the case where for example the band pass filter 14 has a circular plate shape, which facilitates bubbles generated in the bonding member 15 to escape from between the side surfaces 14c of the band pass filter 14 and the inner surface 5a of the side wall 5. As a result, scattering and diffraction of light and the like at the bonding member 15 are suppressed.

Note that if the region of the light emitting surface 13*b* of the light transmitting member 13 facing the opening 2*a* is distorted so as to be recessed toward the opening 2*a*, it is avoided that a region of the light incident surface 14*a* of the band pass filter 14 where light enters is physically brought into contact with the light emitting surface 13*b* of the light transmitting member 13, which can prevent occurrence of a damaged in the region.

Moreover, in the light detection device 1D, the bonding member 15 protrudes outward from the outer edge of the band pass filter 14 when viewed from a direction parallel to the line L, and a part of the bonding member 15 protruding outward from the outer edge of the band pass filter 14 is in contact with side surfaces 14*c* of the band pass filter 14. According to this configuration, the band pass filter 14 is more securely fixed.

In the light detection device 1D, the thickness of the second part 15*b* of the bonding member 15 in the direction parallel to the line L is the maximum at a part in contact with the central part of each of the side surfaces 14*c* and is the minimum at a part in contact with each of the corner parts 14*d* of the band pass filter 14. According to this configuration, for example at the time of curing the bonding member 15, it is possible to suppress occurrence of a crack in the bonding member 15 at parts corresponding to the corner parts 14*d* of the band pass filter 14. However, in a case where the thickness of the second part 15*b* in the direction parallel to the line L is gradually reduced at each of the corner parts 14*d* than at the central part of each of the side surfaces 14*c* for example due to a convex curved surface of the second part 15*b*, the thickness of the second part 15*b* may not be the minimum at a part in contact with each of the corner parts 14*d*. Occurrence of a crack in a corner part 14*d* of the band pass filter 14 can be suppressed unless the thickness of the second part 15*b* is maximized at a part in contact with the respective corner parts 14*d*.

Furthermore, in the light detection device 1D, the opening 2*a* has a circular shape when viewed from a direction parallel to the line L. According to this configuration, the intensity profile of light incident on the package 2 is uniformized.

Moreover, in the light detection device 1D, the band pass filter 14 has a rectangular plate shape. According to this configuration, it is possible to effectively suppress the thermal influence given to the band pass filter 14 from the package 2 while the stability in fixing of the band pass filter 14 on the inner surface 6*a* of the top wall 6 of the package 2 is ensured. Furthermore, it becomes further easier for air bubbles generated in the bonding member 15 at the time of manufacturing to escape from between the side surfaces 14*c* of the band pass filter 14 and the inner surface 5*a* of the side wall 5 of the package 2, and thus scattering and diffraction of light and the like at the bonding member 15 are suppressed. Furthermore, the manufacturing cost of the band pass filter 14 by wafer processing is reduced.

In the light detection device 1D, the package 2 is formed of a metal material. Since hermetic sealing is possible according to this configuration, airtightness of the package 2 is improved for example as compared with a package 2 formed of plastic. As a result, processing for countermeasures against humidity of each component accommodated inside the package 2 becomes unnecessary, and the manufacturing cost of the light detection device 1D is reduced. Furthermore, if the package 2 is formed of a metal material, the strength of the package 2 is improved as compared to a package 2 formed of, for example, plastic, and thus each component accommodated inside the package 2 protected from external physical impact. Furthermore, if the package 2 is formed of a metal material, electrical shielding is facilitated. Note that in the case where the package 2 is formed of a metal material, the thermal conductivity of the package 2 is increased. However as described above, since the side wall 5 of the package 2 has a cylindrical shape while the band pass filter 14 has a rectangular plate shape, the band pass filter 14 is unlikely to be affected by heat from the package 2.

In contrast, in the light detection device 1D, the outer edge of the Fabry-Perot interference filter 10 is positioned outside the outer edge of the opening 2*a* of the package 2, and the outer edge of the light transmitting member 13 is positioned outside the outer edge of the Fabry-Perot interference filter 10. This can prevent light from entering the package 2 via the side surfaces 13*c* of the light transmitting member 13 due to an incident angle of light at the opening 2*a*, diffraction at the opening 2*a*, etc. and becoming stray light. This can further prevent light, which has become stray light due to an incident angle of light at the opening 2*a*, diffraction at the opening 2*a*, etc., from entering the light detector 8.

The prevention of stray light from entering the light detector 8 will be described in more detail. A part of light entering the opening 2*a* of the package 2 may be emitted from the side surfaces 13*c* of the light transmitting member 13 into the package 2 due to an incident angle of light at the opening 2*a*, diffraction at the side surface of the opening 2*a* and at an emitting side corner (corner where the side surface of the opening 2*a* meets the inner surface 6*a* of the top wall 6), etc. When such light is multiple-reflected within the package 2 and enters the light detector 8, this appears as noise due to stray light in an output signal, which leads to degradation of light detecting characteristics. In particular, since the side surfaces 13*c* of the light transmitting member 13 are often rougher than the light incident surface 13*a* and the light emitting surface 13*b* of the light transmitting member 13 in many cases, light emitted from the side surfaces 13*c* of the light transmitting member 13 into the package 2 is likely to be scattered and to enter the light detector 8. Contrary, in the light detection device 1D, the outer edge of the Fabry-Perot interference filter 10 is positioned outside the outer edge of the opening 2*a* of the package 2, and the outer edge of the light transmitting member 13 is positioned outside the outer edge of the Fabry-Perot interference filter 10. Moreover, the outer edge of the light transmitting member 13, that is, the side surface 13*c* of the light transmitting member 13 is in contact with the inner surface 5*a* of the side wall 5 of the package 2. As a result, for example as compared with the case where the outer edge of the light transmitting member 13 is positioned inside the outer edge of the Fabry-Perot interference filter 10, the side surfaces 13*c* of the light transmitting member 13 are positioned apart from the light transmission region 10*a* of the Fabry-Perot interference filter 10 and the light detector 8. Moreover, the side surface 13*c* of the light transmitting member 13 is in contact with the inner surface 5*a* of the side wall 5 of the package 2 and is covered by the inner surface 5*a*. Therefore, the incidence of stray light on the light detector 8 is suppressed, and the S/N ratio and the resolution are improved.

Furthermore in the light detection device 1D, an outer edge of the light transmission region 10*a* of the Fabry-Perot interference filter 10 is positioned outside an outer edge of the light detector 8. The outer edge of the opening 2*a* is positioned outside the outer edge of the light transmission region 10a of the Fabry-Perot interference filter 10. The outer edge of the Fabry-Perot interference filter 10 is positioned outside the outer edge of the opening 2a. The outer edge of the band pass filter 14 is positioned outside the outer edge of the Fabry-Perot interference filter 10. As a result, it is ensured that light incident on the light detector 8 via the opening 2a and the light transmission region 10a of the Fabry-Perot interference filter 10 has been transmitted by the band pass filter 14.

Furthermore in the light detection device 1D, an outer edge of the Fabry-Perot interference filter 10 is positioned outside an outer edge of the light detector 8. This can prevent light not transmitted by the light transmission region 10a of the Fabry-Perot interference filter 10 from entering the light detector 8 as stray light.

Moreover, the light detection device 1D includes the light transmitting member 13. In the light detection device 1D, the thickness T of the light transmitting member 13 is a value larger than or equal to a value obtained by multiplying the distance D1 between the Fabry-Perot interference filter 10 and the light transmitting member 13 by 0.3. As a result, since the heat capacity of the light transmitting member 13 is increased while the volume of the space in the package 2 is reduced, the temperature in the package 2 can be uniformized. Therefore, each unit accommodated in the package 2 such as the band pass filter 14 and the Fabry-Perot interference filter 10 is less likely to be affected by a temperature change. Furthermore, since the light transmitting member 13 moves relatively closer to the Fabry-Perot interference filter 10, this can prevent light not transmitted by the light transmission region 10a of the Fabry-Perot interference filter 10 from entering the light detector 8 as stray light. Note that, in order to uniformize the temperature in the package 2 and to further suppress incidence of stray light on the light detector 8, it is preferable that the thickness T is a value larger than or equal to a value obtained by multiplying the distance D1 by 0.6.

Moreover, in the light detection device 1D, the thickness T of the light transmitting member 13 is a value larger than or equal to the distance D2 between the Fabry-Perot interference filter 10 and the light detector 8. As a result, since the heat capacity of the light transmitting member 13 is increased while the volume of the space in the package 2 is reduced, the temperature in the package 2 can be further uniformized.

In the light detection device 1D, the terminals 25 and 26 of the Fabry-Perot interference filter 10 and the lead pins 11 are electrically connected by wires 12. As described above, in the light detection device 1D, the outer edge of the Fabry-Perot interference filter 10 is positioned outside the outer edge of the opening 2a of the package 2, and the outer edge of the light transmitting member 13 is positioned outside the outer edge of the Fabry-Perot interference filter 10. Moreover, the outer edge of the light transmitting member 13, that is, the side surface 13c of the light transmitting member 13 is in contact with the inner surface 5a of the side wall 5 of the package 2. In other words, the light transmitting member 13 covers the entire inner surface 6a of the top wall 6 of the package 2. Therefore, even if the wires 12 bend, contact between the wires 12 and the inner surface 6a of the top wall 6 of the package 2 can be prevented.

Prevention of contact between the wires 12 and the package 2 will be described more specifically. When a wire 12 is brought into contact with the package 2 made of metal, an electric signal for controlling the Fabry-Perot interference filter 10 also flows in the package 2, which makes it difficult to control the Fabry-Perot interference filter 10. Contrary to this, even when a wire 12 is brought into contact with the light transmitting member 13 made of an insulating material, an electric signal for controlling the Fabry-Perot interference filter 10 does not flow in the light transmitting member 13, and thus the Fabry-Perot interference filter 10 can be controlled with a high accuracy. The above configuration that can prevent contact between the wires 12 and the package 2 is important.

Furthermore, in the light detection device 1D, a silicon substrate is adopted as the substrate 21 of the Fabry-Perot interference filter 10, and an InGaAs substrate formed with a photoelectric conversion region is adopted as the light detector 8, whereby the following actions and effects are achieved. The light detector 8 having the InGaAs substrate formed with the photoelectric conversion region has a high sensitivity to light having a wavelength within a range between 1200 nm and 2100 nm, for example, as compared to light having a wavelength shorter than 1200 nm and light having a wavelength longer than 2100 nm. However, the light detector 8 has a high sensitivity to light having a wavelength shorter than 1200 nm as compared with light having a wavelength longer than 2100 nm. Meanwhile, the silicon substrate has a higher absorptivity to light having a wavelength shorter than 1200 nm as compared with light having a wavelength of 1200 nm or more (although this depends on a manufacturing method, the thickness, and an impurity concentration of the silicon substrate, a high absorptivity is exhibited especially for light having a wavelength shorter than 1100 nm). Therefore, with the above configuration, for example in a case where light having a wavelength within the range between 1200 nm and 2100 nm should be detected, the silicon substrate of the Fabry-Perot interference filter 10 can be caused to function as a high-pass filter. As a result, it is possible to securely suppress detection of noise light (light having a wavelength shorter than 1200 nm (in particular, shorter than 1100 nm) and light having a wavelength longer than 2100 nm) by the light detector 8 by the synergistic effect with the band pass filter 14.

In contrast, in the light detection device 1D, the outer edge of the Fabry-Perot interference filter 10 of a chip shape is positioned outside the outer edge of the opening 2a of the package 2, and the outer edge of the light transmitting unit 100 is positioned outside the outer edge of the Fabry-Perot interference filter 10. This can prevent light from entering the package 2 via the side surface of the light transmitting unit 100 due to an incident angle of light at the opening 2a, diffraction at the opening 2a, etc. and becoming stray light. This can further prevent light, which has become stray light due to an incident angle of light at the opening 2a, diffraction at the opening 2a, etc., from entering the light detector 8. Furthermore, for example as compared to a case where the outer edge of the light transmitting unit 100 is positioned inside the outer edge of the Fabry-Perot interference filter 10, the heat capacity of the light transmitting unit 100 and a thermally connected area between the light transmitting unit 100 and the package 2 increases, and thus as a result the temperature in the package 2 can be uniformized. As described above, light detecting characteristics are improved in the light detection device 1D.

Fourth Embodiment

[Configuration of Light Detection Device]

Figure 12:
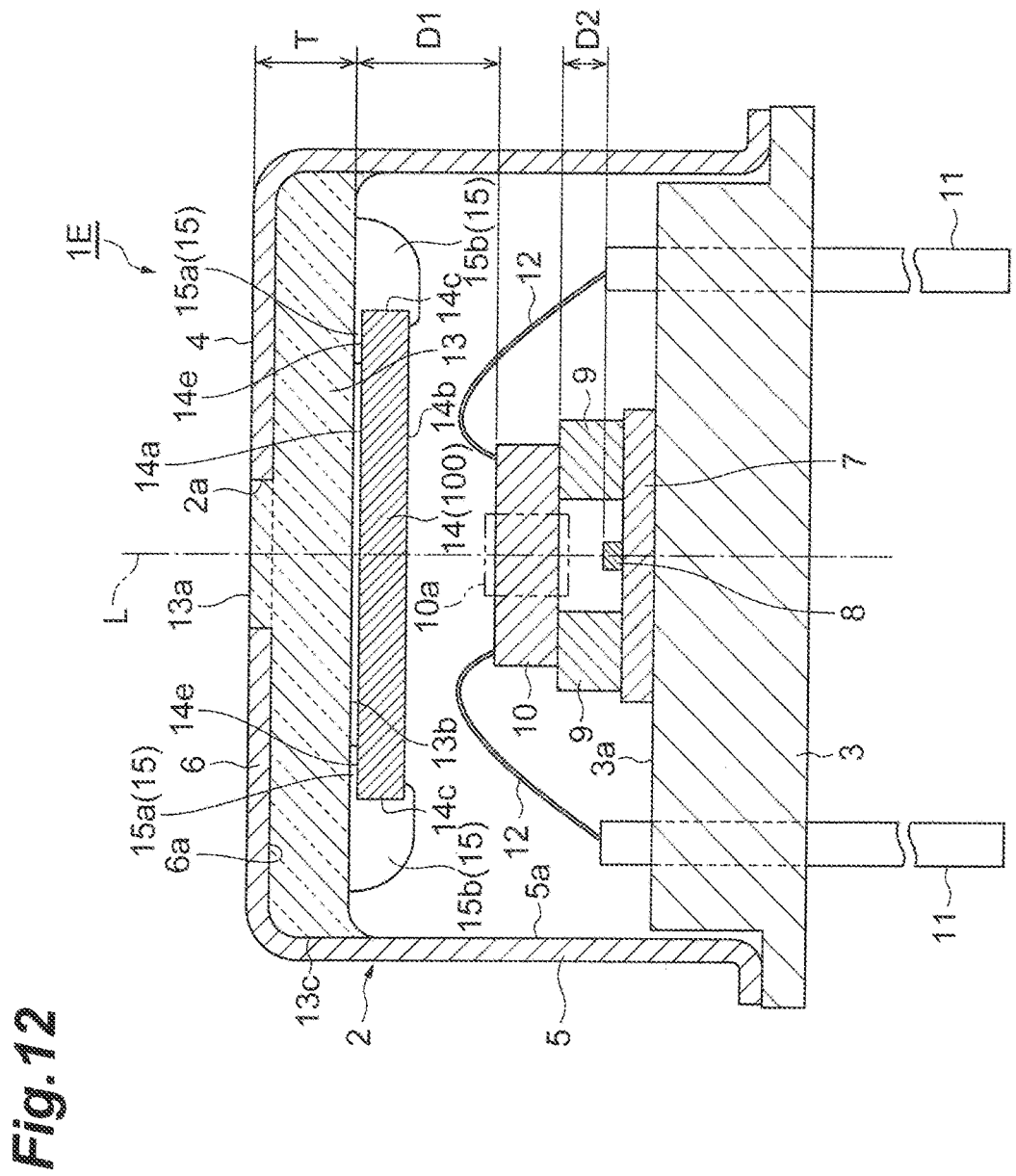
FIG. 12 is a cross-sectional view of a light detection device of a fourth embodiment.
Figure 13:
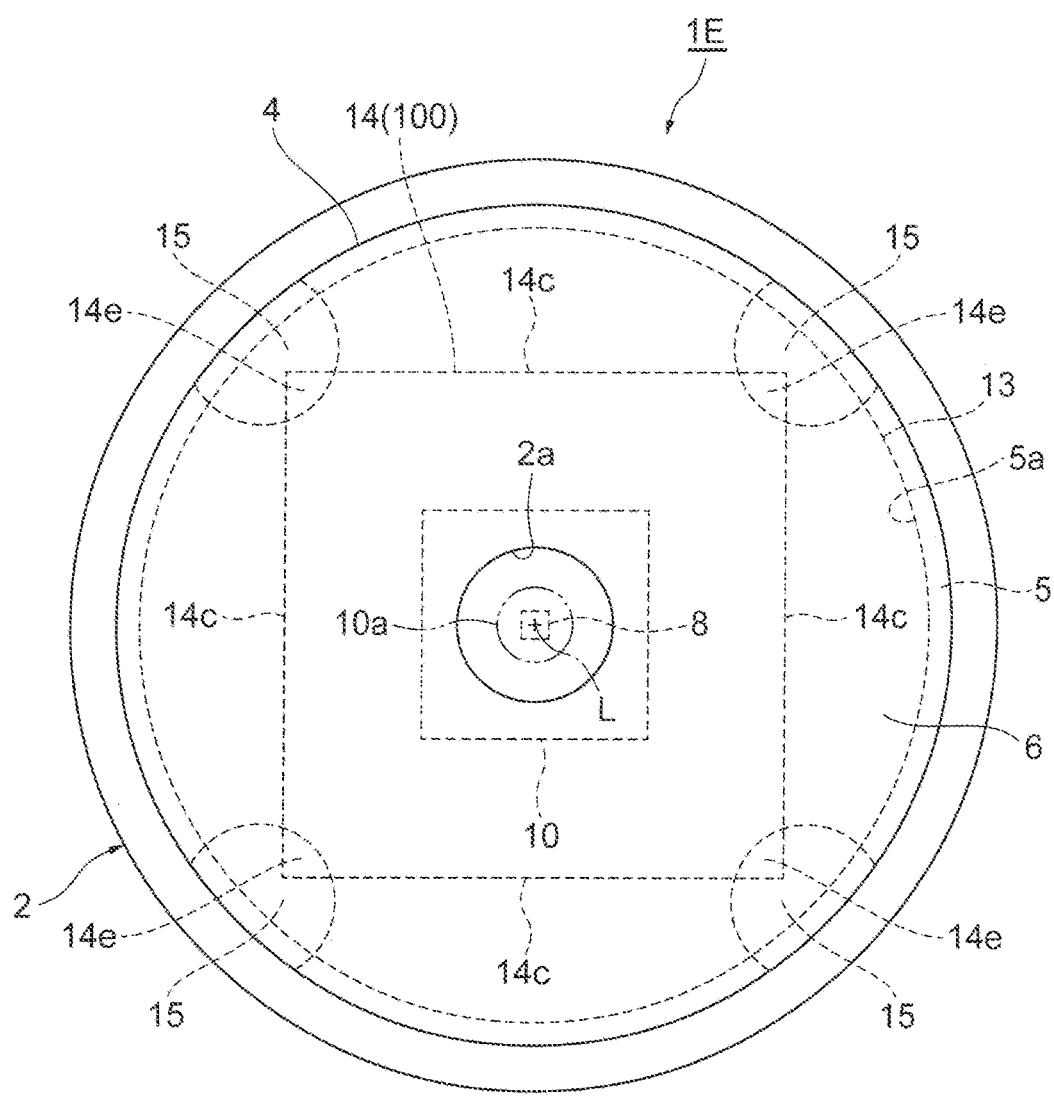
FIG. 13 is a plan view of the light detection device of FIG. 12.

As illustrated in FIGS. 12 and 13, a light detection device 1E is different from the light detection device 1D described above mainly in the point that a bonding member 15 is arranged so as to correspond to each corner part (corner part formed by adjacent side surfaces 14c) of the band pass filter 14.

In the light detection device 1E, at each of the corner parts of the band pass filter 14, a first part 15a of the bonding member 15 is arranged at a corner region 14e out of a light incident surface 14a of the band pass filter 14 (out of the light incident surface 14a, a region including a corner part formed by adjacent side surfaces 14c). That is, the first part 15a is arranged between the light emitting surface 13b of the light transmitting member 13 and the corner regions 14e of the band pass filter 14 facing each other. In each of the corner parts of the band pass filter 14, a second part 15b of the bonding member 15S protrudes outward from the outer edge of the band pass filter 14 when viewed from a direction parallel to the line L. The second part 15b extends to the inner surface 5a of the side wall 5 and is in contact with the inner surface 5a of the side wall 5. The second part 15b is in contact with the side surfaces 14c of the band pass filter 14. The second part 15b covers regions of the light emitting surface 14b of the band pass filter 14 that face the corner regions 14e. As a result, the band pass filter 14 is more securely fixed. At this time, since the corner regions 14e of the band pass filter 14 are positioned so as to be farthest from the opening 2a, there is a low possibility that the second parts 15b covering regions of the light emitting surface 14b facing the corner regions 14e cover a region of the light emitting surface 14b facing the light transmission region 10a. Moreover, the bonding members 15 at the respective corner parts of the band pass filter 14 are separated from each other. As described above, in the light detection device 1E, the bonding members 15 are not arranged at a region of the light incident surface 14a of the band pass filter 14 excluding the corner regions 14e but is arranged at the corner regions 14e. Note that also in the light detection device 1E, the bonding members 15 fix the band pass filter 14 on the inner surface 6a of the top wall 6 via the light transmitting member 13 joined to the inner surface 6a of the top wall 6.

Also in the light detection device 1E, like in the light detection device 1D as described above, the band pass filter 14 forms a light transmitting unit 100. That is, the light transmitting unit 100 includes the band pass filter 14 that transmits light incident on the light transmission region 10a of the Fabry-Perot interference filter 10.

Note that if the region of the light emitting surface 13b of the light transmitting member 13 facing the opening 2a is distorted so as to be recessed toward the opening 2a, it is avoided that a region of the light incident surface 14a of the band pass filter 14 where light enters is physically brought into contact with the light emitting surface 13b of the light transmitting member 13, which can prevent occurrence of a damaged in the region. Furthermore, it is possible to prevent the bonding members 15 arranged so as to correspond to the respective corner parts of the band pass filter 14 from entering the region of the light emitting surface 13b of the light transmitting member 13 facing the opening 2a. This is because a region surrounding the region of the light emitting surface 13b of the light transmitting member 13 facing the opening 2a tends to swell.

[Actions and Effects]

As described above, according to the light detection device 1E, the band pass filter 14 can be caused to function properly like the light detection device 1D described above. Moreover, in the light detection device 1E, like the light detection device 1D described above, light detecting characteristics are improved.

The light detection device 1E further includes the light transmitting member 13 arranged on the inner surface 6a of the top wall 6 so as to close the opening 2a, in which the band pass filter 14 is fixed to the light emitting surface 13b of the light transmitting member 13 by the bonding member 15, and the bonding members 15 are not arranged at a region of the light incident surface 14a of the band pass filter 14 excluding the corner regions 14e facing the light emitting surface 13b of the light transmitting member 13 but is arranged at the corner regions 14e. According to this configuration, since the bonding member 15 is not arranged in a region of the light incident surface 14a of the band pass filter 14 excluding the corner regions 14e, scattering and diffraction of light and the like at the bonding member 15 are more securely suppressed. Furthermore, according to this configuration, since the light transmitting member 13 is provided, airtightness of the package 2 is improved. Furthermore, since the band pass filter 14 is fixed to the light emitting surface 13b of the light transmitting member 13, thermal influence from the package 2 is unlikely to be received.

Furthermore, since the bonding members 15 are not arranged at the region of the light incident surface 14a of the band pass filter 14 excluding the corner regions 14e, the usage amount of the bonding members 15 is reduced. This reduces the amount of outgas remaining in the package 2 and reduces the amount of outgas adhered to the Fabry-Perot interference filter 10 and a light receiving surfaces of the light detector 8. Therefore, the Fabry-Perot interference filter 10 and the light detector 8 are unlikely to be subjected to a change in and deterioration of light detecting characteristics and the like.

Fifth Embodiment

[Configuration of Light Detection Device]

Figure 14:
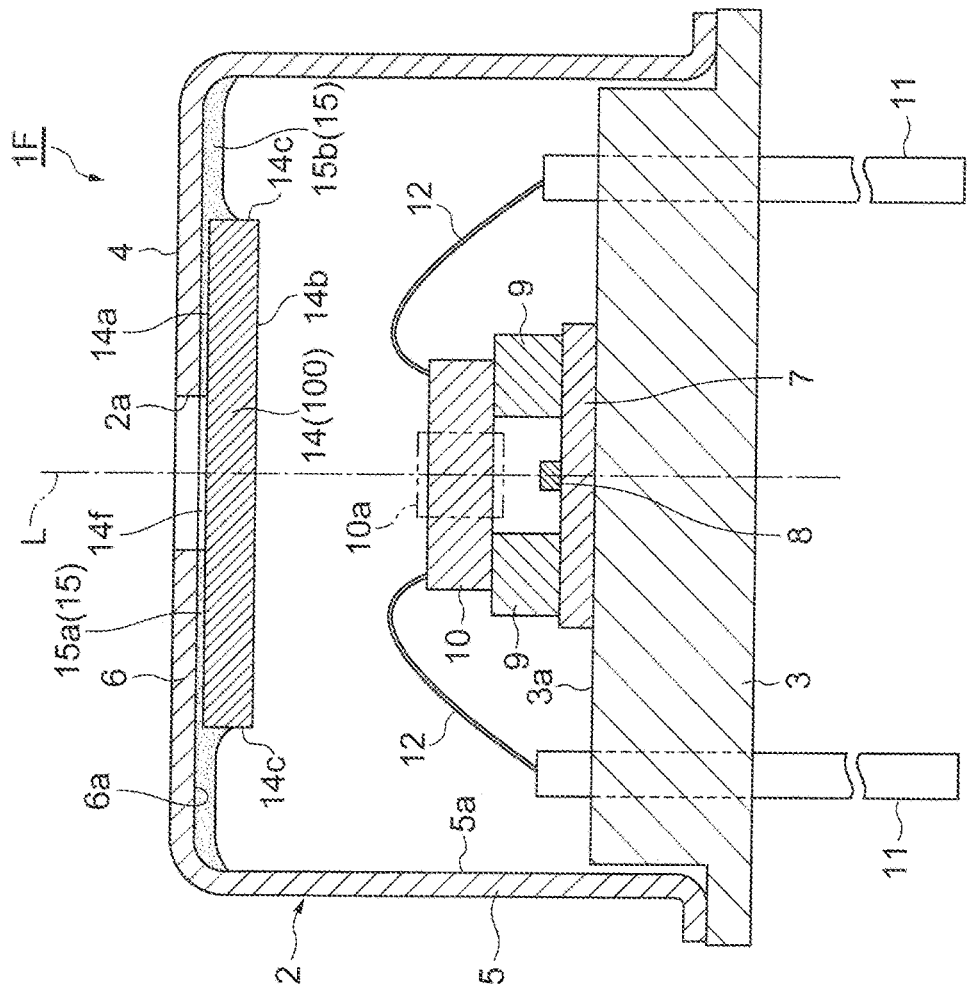
FIG. 14 is a cross-sectional view of a light detection device of a fifth embodiment.
Figure 15:
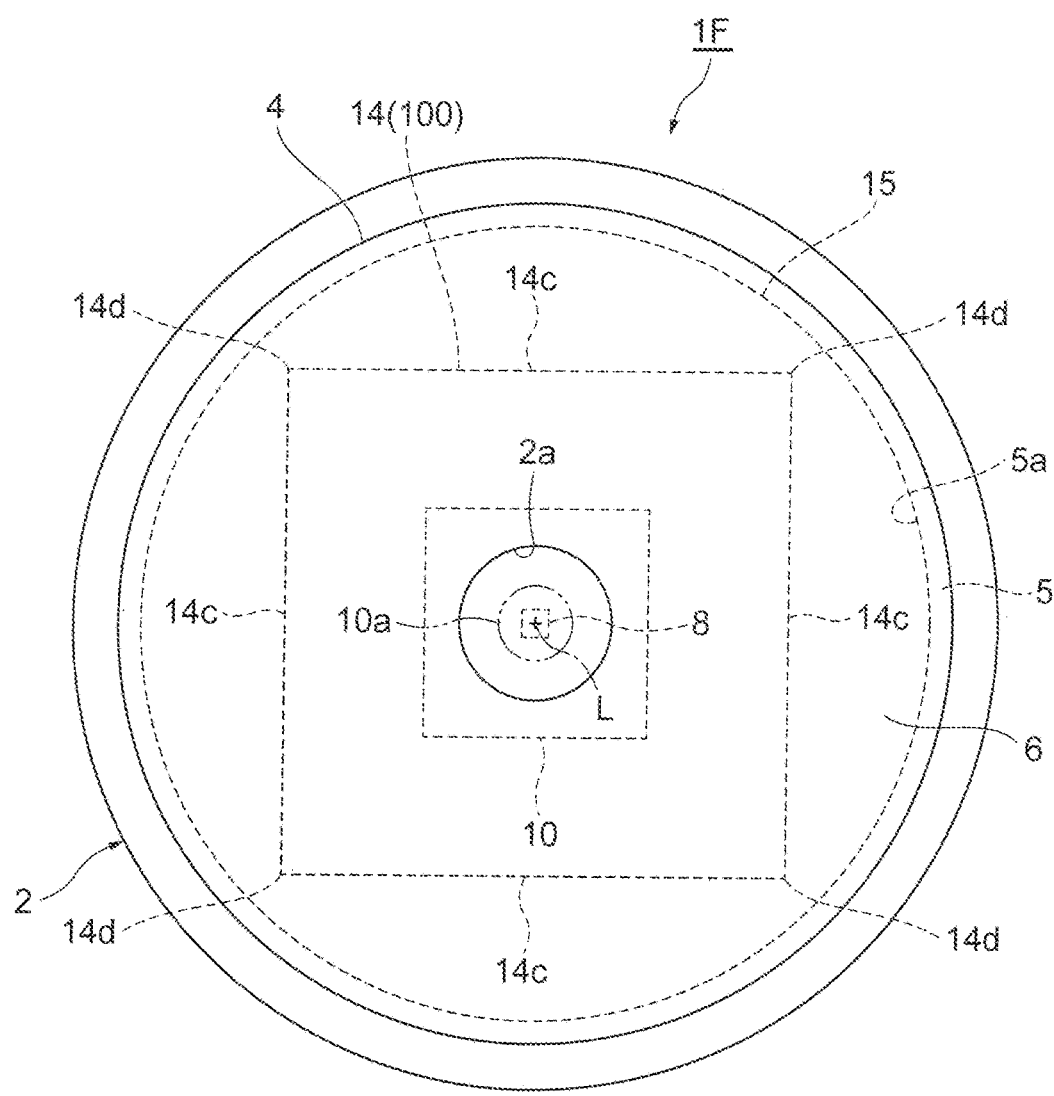
FIG. 15 is a plan view of the light detection device of FIG. 14.

As illustrated in FIGS. 14 and 15, a light detection device 1F is mainly different from the light detection device 1D described above in that the light transmitting member 13 is not included.

In the light detection device 1F, a band pass filter 14 is directly fixed to an inner surface 6a of a top wall 6 by a bonding member 15. That is, in the light detection device 1F, the bonding member 15 fixes the band pass filter 14 on the inner surface 6a of the top wall 6 without interposing another member (such as the light transmitting member 13 joined to the inner surface 6a of the top wall 6). A first part 15a of the bonding member 15 is arranged at a region of a light incident surface 14a of the band pass filter 14 facing the inner surface 6a of the top wall 6 excluding an opposed region 14f facing the opening 2a. That is, the first part 15a is arranged between the inner surface 6a of the top wall 6 and the region (that is, the region of the light incident surface 14a of the band pass filter 14 excluding the opposed region 14t) facing each other. A second part 15b of the bonding member 15 protrudes outward from the outer edge of the band pass filter 14 when viewed from a direction parallel to the line L. The second part 15b extends to the inner surface 5a of the side wall 5 and is in contact with the inner surface 5a of the side wall 5. The second part 15b is in contact with the side surfaces 14c of the band pass filter 14.

Also in the light detection device 1F, like in the light detection device 1D as described above, the band pass filter 14 forms a light transmitting unit 100. That is, the light transmitting unit 100 includes the band pass filter 14 that transmits light incident on the light transmission region 10a of the Fabry-Perot interference filter 10.

[Actions and Effects]

As described above, according to the light detection device 1F, the band pass filter 14 can be caused to function properly like the light detection device 1D described above. Moreover, in the light detection device 1F, like the light detection device 1D described above, light detecting characteristics are improved.

Furthermore, in the light detection device 1F, the band pass filter 14 is fixed to the inner surface 6a of the top wall 6 by the bonding member 15, and the bonding member 15 is arranged at a region of the light incident surface 14a of the band pass filter 14 facing the inner surface 6a of the top wall 6 excluding the opposed region 14f facing to the opening 2a. According to this configuration, since the bonding member 15 is arranged in the region of the light incident surface 14a of the band pass filter 14 other than the opposed region 14f facing the opening 2a, the band pass filter 14 is securely fixed on the inner surface 6a of the top wall 6. Furthermore, even if air bubbles are generated in the bonding member 15 at the time of manufacturing, the air bubbles easily escape not only from between the side surfaces 14c of the band pass filter 14 and the inner surface 5a of the side wall 5 but also from the opening 2a, scattering and diffraction of light and the like at the bonding member 15 are suppressed.

Sixth Embodiment

[Configuration of Light Detection Device]

Figure 16:
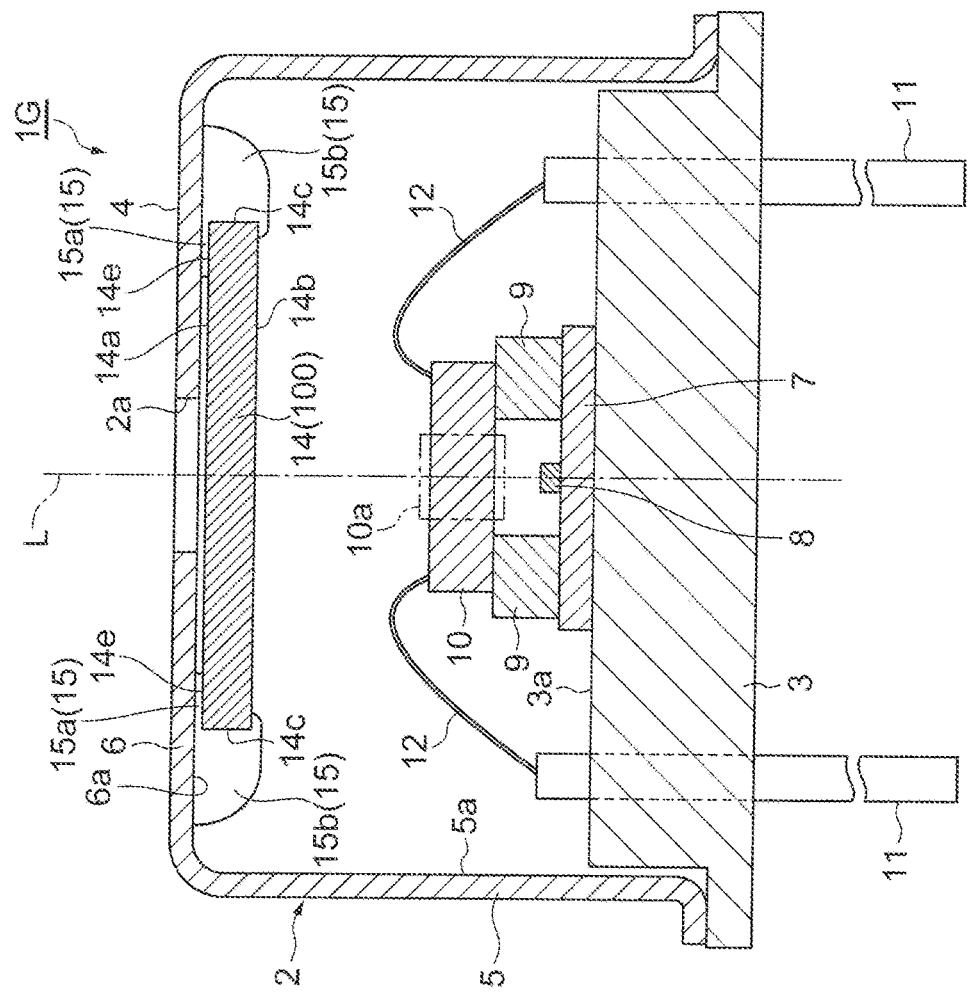
FIG. 16 is a cross-sectional view of a light detection device of a sixth embodiment.
Figure 17:
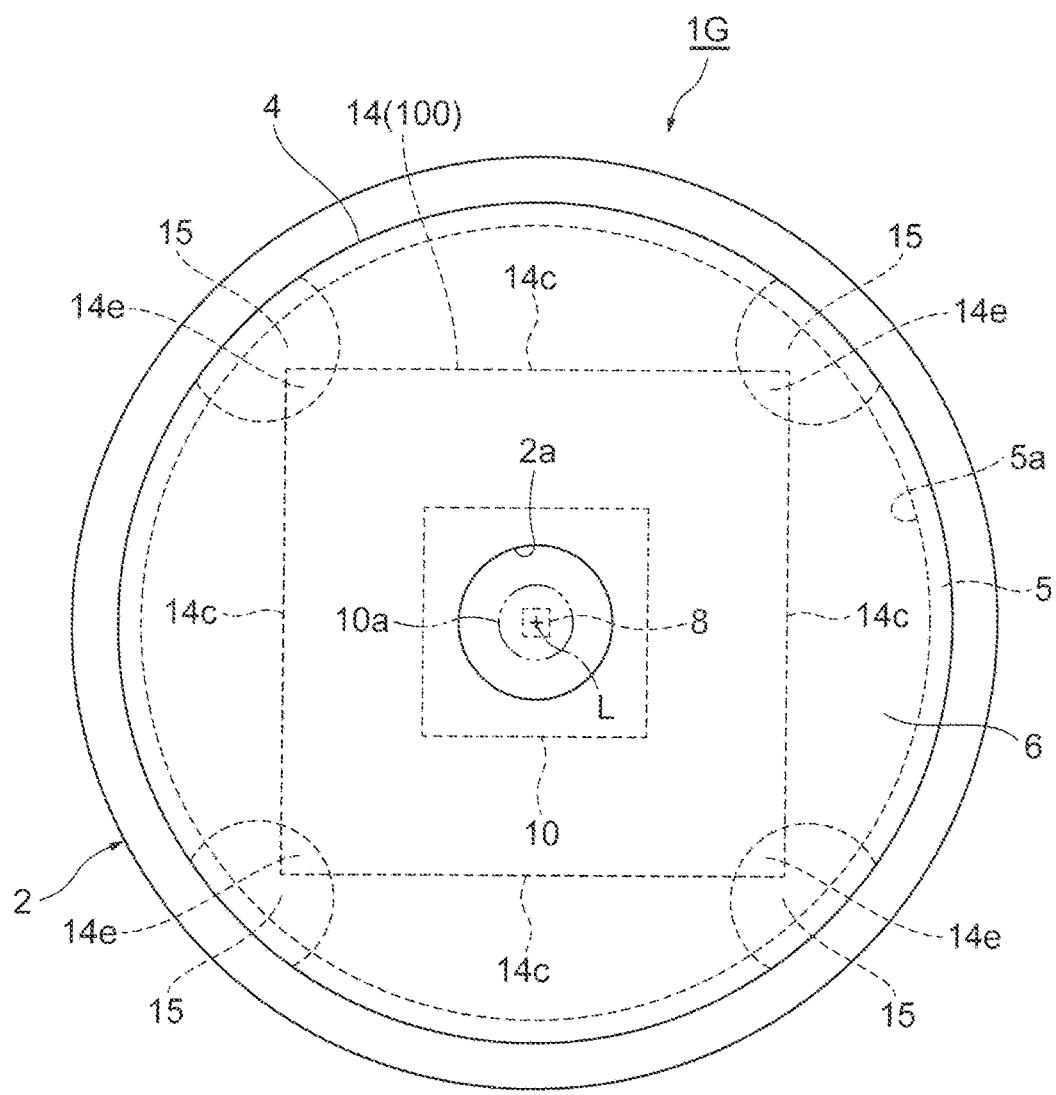
FIG. 17 is a plan view of the light detection device of FIG. 16.

As illustrated in FIGS. 16 and 17, a light detection device 10 is mainly different from the light detection device 1E described above in that the light transmitting member 13 is not included.

In the light detection device 1G, a band pass filter 14 is directly fixed to an inner surface 6a of a top wall 6 by bonding members 15. That is, in the light detection device 1G, the bonding members 15 fix the band pass filter 14 on the inner surface 6a of the top wall 6 without interposing another member (such as the light transmitting member 13 joined to the inner surface 6a of the top wall 6). In each corner part of the band pass filter 14, a first part 15a of a bonding member 15 is arranged at a corner region 14e of a light incident surface 14a of the band pass filter 14. That is, the first part 15a is arranged between the inner surface 6a of the top wall 6 and the corner regions 14 of the band pass filter 14 facing each other. In each of the corner parts of the band pass filter 14, a second part 15b of the bonding member 15 protrudes outward from the outer edge of the band pass filter 14 when viewed from a direction parallel to the line L. The second part 15b extends to the inner surface 5a of the side wall 5 and is in contact with the inner surface 5a of the side wall 5. The second part 5b is in contact with the side surfaces 14c of the band pass filter 14. The second part 15b covers regions of the light emitting surface 14b of the band pass filter 14 that face the corner regions 14e. As a result, the band pass filter 14 is more securely fixed. At this time, since the corner regions 14e of the band pass filter 14 are positioned so as to be farthest from the opening 2a, there is a low possibility that the second parts 15b covering regions of the tight emitting surface 14b facing the corner regions 14e cover a region of the light emitting surface 14b facing the light transmission region 10a. Moreover, the bonding members 15 at the respective corner parts of the band pass filter 14 are separated from each other. As described above, in the light detection device 1G, the bonding members 15 are not arranged at a region of the light incident surface 14a of the band pass filter 14 excluding the corner regions 14e but is arranged at the corner regions 14e.

Also in the light detection device 1G, like in the light detection device 1D as described above, the band pass filter 14 forms a light transmitting unit 100. That is, the light transmitting unit 100 includes the band pass filter 14 that transmits light incident on the light transmission region 10a of the Fabry-Perot interference filter 10.

[Actions and Effects]

As described above, according to the light detection device 14 the band pass filter 14 can be caused to function properly like the light detection device 1D described above. Moreover, in the light detection device 1G, like the light detection device 1D described above, light detecting characteristics are improved.

Furthermore, in the light detection device IQ the band pass filter 14 is fixed to the inner surface 6a of the top wall 6 by the bonding members 15, and the bonding members 15 are not arranged at a region of the light incident surface 14a of the band pass filter 14 facing the inner surface 6a of the top wall 6 excluding the corner regions 14c but are arranged at the corner regions 14e. According to this configuration, since the bonding member 15 is not arranged in a region of the light incident surface 14a of the band pass filter 14 excluding the corner regions 14e, scattering and diffraction of light and the like at the bonding member 15 are more securely suppressed.

[Modifications]

Although the third embodiment, the fourth embodiment, the fifth embodiment, and the sixth embodiment of the present disclosure have been described above, one embodiment of the present disclosure is not limited to the respective embodiments described above. For example, the materials and the shapes of the respective configurations are not limited to the aforementioned materials or shapes but may employ various materials or shapes.

Moreover, in the respective embodiments, the bonding member 15 may not protrude outward from the outer edge of the band pass filter 14 when viewed from a direction parallel to the line L. In each of the embodiments, the second part 15b of the bonding member 15 protruding outward from the outer edge of the band pass filter 14 may not extend to the inner surface 5a of the side wall 5 and may be separated from the inner surface 5a of the side wall 5. For example, in a case where a material of the bonding member 15 is light transmitting resin, from the viewpoint of improving the fixing strength of the band pass filter 14 to the inner surface 6a of the top wall 6, it is preferable that the second part 15b extends to the inner surface 5a of the side wall 5. However, for example in the case where a material of the bonding members 15 is a low melting point glass or a resin having a high hardness, from the viewpoint of preventing a crack from occurring in a bonding member 15 due to a stress acting on the bonding member 15 from the side wall 5, it is preferable that the second part 15b does not extend to the inner surface 5a of the side wall 5.

Moreover, in the third embodiment and the fifth embodiment, the thickness of the second part 15b of the bonding member 15 in the direction parallel to the line L may be the maximum at a part in contact with the inner surface 5a of the side wall 5 depending on the viscosity of the bonding member 15. As a result, for example at the time of curing the bonding members 15, it is possible to suppress occurrence of a crack in the bonding members 15 at parts corresponding to the corner parts 14d of the band pass filter 14. Furthermore, the bonding member 15 is prevented from reaching the light emitting surface 14b of the band pass filter 14.

Moreover, in the fourth embodiment, the fifth embodiment, and the sixth embodiment, since a bonding member 15 is not arranged in a region facing the opening 2a on the line L, a material of the bonding member 15 may be a material that does not transmit light.

Furthermore, in the sixth embodiment, after the band pass filter 14 is fixed to the inner surface 6a of the top wall 6 by the bonding member 15 arranged in the corner regions 14e, the bonding member 15 may be further filled between the inner surface 6a of the top wall 6 and the light incident surface 14a of the band pass filter 14 from a region of the outer edge of the band pass filter 14 where the bonding member 15 is not arranged when viewed from a direction parallel to the line L. Note that, at this time, the bonding member 15 is prevented from entering the opposed region of the light incident surface 14a of the band pass filter 14 facing the opening 2a.

Moreover, the shape of the band pass filter 14 is not limited to a rectangular plate shape and may be a polygonal plate shape. In that case also, the band pass filter 14 is positioned with a high accuracy by the respective corner parts, and the band pass filter 14 becomes less likely to be affected by heat from the package 2. Therefore, even in a case where the band pass filter 14 has a polygonal plate shape, the band pass filter 14 can function properly.

Furthermore, depending on the type of a light receiving element used as the light detector 8, the band pass filter 14 is required not only cuts off multi-order light having an order higher than or equal to three appearing on a shorter wavelength side but also to cut off light appearing on a longer wavelength (for example, a=1) side. That is, in a light detection device for obtaining an optical spectrum with respect to an A-th order light (a=A), it is necessary to cut off both higher order light (a>A) appearing on the shorter wavelength side and lower order light (a<A) appearing on the longer wavelength side.

Moreover, the package 2 is not limited to the CAN package as described above and may be any package as described in the following. That is, the package 2 may be any package as long as the package includes a first wall part formed with an opening 2a, a Fabry-Perot interference filter 10, a second wall part facing the first wall part with a band pass filter 14 and a light detector 8 interposed therebetween, and a cylindrical side wall part surrounding the Fabry-Perot interference filter 10, the band pass filter 14, and the light detector 8.

REFERENCE SIGNS LIST 1A, 1B, 1C, 1D, 1E, 1F, 1G . . . light detection device, 2 . . . package, 2a . . . opening, 3 . . . stem (second wall part), 5 . . . side wall (side wall part), 6 . . . top wall (first wall part), 6a . . . inner surface, 8 . . . light detector, 10 . . . Fabry-Perot interference filter, 10a . . . light transmission region, 11 . . . lead pin, 12 . . . wire, 13 . . . light transmitting member, 13b . . . light emitting surface (inner surface), 14 . . . band pass filter, 14a . . . light incident surface, 14c . . . side surface, 14e . . . corner region, 14f . . . opposed region, 15 . . . bonding member, 35 . . . first mirror, 36 . . . second mirror, L . . . line

The invention claimed is:

1. A light detection device, comprising:
a Fabry-Perot interference filter having a first mirror and a second mirror, a distance there between is variable, and provided with a light transmission region on a predetermined line, the light transmission region configured to transmit light corresponding to the distance between the first mirror and the second mirror;
a light detector arranged on a first side of the Fabry-Perot interference filter on the line, the light detector configured to detect light transmitted through the light transmission region;
a package having an opening positioned on a second side of the Fabry-Perot interference filter on the line, the package configured to accommodate the Fabry-Perot interference filter and the light detector; and
a light transmitting unit arranged on an inner surface of the package so as to close the opening and including a band pass filter configured to transmit light incident on the light transmission region,
wherein the light transmission unit has a side surface disposed in the package,
when viewed from a direction parallel to the line, an outer edge of the Fabry-Perot interference filter is positioned outside an outer edge of the opening, and an outer edge of the light transmitting unit is positioned outside the outer edge of the Fabry-Perot interference filter, and
wherein a thickness of the light transmitting unit is a value larger than a distance between the Fabry-Perot interference filter and the light detector.

2. The light detection device according to claim 1, wherein the light transmitting unit further includes a light transmitting member provided with the band pass filter, and
an outer edge of the light transmitting member is positioned outside the outer edge of the Fabry-Perot interference filter when viewed from a direction parallel to the line.

3. The light detection device according to claim 2, wherein an outer edge of the band pass filter is positioned outside the outer edge of the Fabry-Perot interference filter when viewed from a direction parallel to the line.

4. The light detection device according to claim 2, wherein a thickness of the light transmitting member is a value larger than or equal to a value obtained by multiplying a distance between the Fabry-Perot interference filter and the light transmitting member by 0.5.

5. The light detection device according to claim 2, wherein the Fabry-Perot interference filter has a silicon substrate configured to support the first mirror and the second mirror, and
the light detector has an InGaAs substrate formed with a photoelectric conversion region.

6. The light detection device according to claim 2, wherein the band pass filter is provided on a light emitting surface of the light transmitting member.

7. The light detection device according to claim 2, further comprising:
a lead pin penetrating through the package; and
a wire electrically connecting a terminal of the Fabry-Perot interference filter and the lead pin.

* * * * *